(12) United States Patent
Luschtinetz et al.

(10) Patent No.: US 11,145,817 B2
(45) Date of Patent: Oct. 12, 2021

(54) ORGANIC LIGHT EMITTING DIODE COMPRISING AN ORGANIC SEMICONDUCTOR LAYER

(71) Applicant: Novaled GmbH, Dresden (DE)

(72) Inventors: Regina Luschtinetz, Dresden (DE); Francois Cardinali, Dresden (DE); Julien Frey, Dresden (DE); Domagoj Pavicic, Dresden (DE)

(73) Assignee: Novaled GmbH, Dresden (DE)

( * ) Notice: Subject to any disclaimer, the term of this patent is extended or adjusted under 35 U.S.C. 154(b) by 460 days.

(21) Appl. No.: 16/092,974

(22) PCT Filed: Apr. 7, 2017

(86) PCT No.: PCT/EP2017/058467
§ 371 (c)(1),
(2) Date: Oct. 11, 2018

(87) PCT Pub. No.: WO2017/178392
PCT Pub. Date: Oct. 19, 2017

(65) Prior Publication Data
US 2019/0131531 A1    May 2, 2019

(30) Foreign Application Priority Data

Apr. 12, 2016    (EP) .................................... 16164871

(51) Int. Cl.
*H01L 51/00* (2006.01)
*C07F 9/53* (2006.01)
(Continued)

(52) U.S. Cl.
CPC ........ *H01L 51/0052* (2013.01); *C07F 9/5325* (2013.01); *H01L 51/0077* (2013.01);
(Continued)

(58) Field of Classification Search
None
See application file for complete search history.

(56) References Cited

U.S. PATENT DOCUMENTS

| 9,502,660 B2 | 11/2016 | Dorok et al. |
| 2003/0165711 A1 | 9/2003 | Kim et al. |

(Continued)

FOREIGN PATENT DOCUMENTS

| EP | 2719741 A2 | 4/2014 |
| EP | 2750214 A2 | 7/2014 |

(Continued)

OTHER PUBLICATIONS

Materials Research Bulletin, 58, (2014), pp. 149-152. (Year: 2014).*

(Continued)

*Primary Examiner* — Dawn L Garrett
(74) *Attorney, Agent, or Firm* — Eversheds Sutherland (US) LLP

(57) ABSTRACT

The invention relates to an Organic light emitting diode comprising an anode electrode, a cathode electrode, at least one emission layer and an organic semiconductor layer, wherein the organic semiconductor layer is arranged between the anode electrode and the cathode electrode and the organic semiconductor layer comprises an alkali organic complex and a compound of formula 1 wherein X is selected from O, S or Se; and $R^1$ and $R^2$ are independently selected from the group consisting of $C_6$ to $C_{18}$ aryl group and $C_5$ to $C_18$ heteroaryl group, wherein each of $R^1$ and $R^2$ may independently be unsubstituted or substituted with at least one $C_1$ to $C_{12}$ alkyl group or $C_1$ to $C_{12}$ alkoxy group, preferably $C_1$ to $C_4$ alkyl group or $C_1$ to $C_4$ alkoxy group; and each $R^3$, $R^4$, $R^5$, and $R^6$ are independently selected from the group consisting of H, $C_1$ to $C_{12}$ alkyl group or $C_1$ to $C_{12}$ alkoxy group, preferably H, $C_1$ to $C_4$ alkyl group or $C_1$ to $C_4$ (Continued)

alkoxy group; a method for preparing the same and the compound of Formula 1 comprised therein.

20 Claims, 3 Drawing Sheets

(51) Int. Cl.
  *H01L 51/50* (2006.01)
  *H01L 51/56* (2006.01)
  *H01L 51/52* (2006.01)
(52) U.S. Cl.
  CPC ...... *H01L 51/5012* (2013.01); *H01L 51/5076* (2013.01); *H01L 51/001* (2013.01); *H01L 51/0021* (2013.01); *H01L 51/5016* (2013.01); *H01L 51/5072* (2013.01); *H01L 51/5206* (2013.01); *H01L 51/5221* (2013.01); *H01L 51/56* (2013.01)

(56) References Cited

U.S. PATENT DOCUMENTS

| | | | |
|---|---|---|---|
| 2005/0245752 A1* | 11/2005 | Conley | C07C 1/321 552/271 |
| 2009/0146139 A1* | 6/2009 | Stoessel | C07C 211/54 257/40 |
| 2014/0048792 A1 | 2/2014 | Chun et al. | |

FOREIGN PATENT DOCUMENTS

| | | | |
|---|---|---|---|
| JP | 2001291593 A | | 10/2001 |
| JP | 2002-063989 A | * | 2/2002 |
| JP | 2008195623 A | | 8/2008 |
| JP | 2009203203 A | | 9/2009 |
| JP | 2012-190863 A | * | 10/2012 |
| KR | 1016950630000 | | 1/2017 |
| WO | 2013/079217 A1 | | 6/2013 |
| WO | 2013/079676 A1 | | 6/2013 |
| WO | 2013/079678 A1 | | 6/2013 |

OTHER PUBLICATIONS

Advanced Functional Materials, 19, (2009), pp. 560-566. (Year: 2009).*
Dyes and Pigments, 89, (2011), pp. 155-161. (Year: 2011).*
Journal of Materials Chemistry C, 3, (2015), pp. 1208-1224. (Year: 2015).*
PCT International Search Report and Written Opinion for PCT Application No. PCT/EP2017/058467 dated Jun. 20, 2017 (8 pages).
European Search Report for EP Application No. 16164871.2 dated Oct. 24, 2016 (3 pages).
European Office Action for EP Application No. 16164871.2 dated Jun. 20, 2018 (3 pages).
Yook et al., "Solution Processed White Phosphorescent Organic Light-Emitting Diodes with a Double Layer Emitting Structure," Organic Electronics, 2011, 12:291-294.
Japanese Office Action for JP Application No. 2018-553376 dated Dec. 22, 2020 (3 pages of English translation).
Taiwanese Office Action for TW Application No. 106110165 dated Sep. 18, 2020 (3 pages of English translation).

* cited by examiner

ORGANIC LIGHT EMITTING DIODE COMPRISING AN ORGANIC SEMICONDUCTOR LAYER

CROSS REFERENCE TO RELATED APPLICATIONS

This application is a U.S. national stage application of PCT/EP2017/058467, filed Apr. 7, 2017, which claims priority to European Application No. 16164871.2, filed Apr. 12, 2016. The content of these applications is incorporated herein by reference.

The present invention relates to an organic light emitting diode (OLED) comprising an organic semiconductor layer, a compound of formula 1 comprised therein and a method of manufacturing the organic light emitting diode (OLED) comprising the organic semiconductor layer.

DESCRIPTION OF THE RELATED ART

Organic light emitting diodes (OLEDs), which are self-emitting devices, have a wide viewing angle, excellent contrast, quick response, high brightness, excellent driving voltage characteristics, and color reproduction. A typical OLED includes an anode electrode, a hole injection layer (HIL), a hole transport layer (HTL), an emission layer (EML), an electron transport layer (ETL), and a cathode electrode, which are sequentially stacked on a substrate. In this regard, the HIL, the HTL, the EML, and the ETL are thin films formed from organic compounds.

When a voltage is applied to the anode electrode and the cathode electrode, holes injected from the anode electrode move to the EML, via the HIL and HTL, and electrons injected from the cathode electrode move to the EML, via the ETL. The holes and electrons recombine in the EML to generate excitons.

It is, therefore, the object of the present invention to provide an organic light emitting diode and compounds for use therein overcoming drawbacks of the prior art. State of the art organic light emitting diodes may suffer from high operating voltage and/or low efficiency and the organic semiconductor materials used in the fabrication of organic light emitting diodes may suffer from low glass transition temperature and/or low volatility.

In light of the prior art, there remains a need to improve performance of OLEDs and organic semiconductor materials, in particular to improve operating voltage, achieve higher efficiency, and to achieve high glass transition temperature and improved volatility of the compounds comprised therein.

SUMMARY

Therefore, it is the object of the present invention to provide an organic light emitting diode having improved operating voltage and efficiency and compound comprised therein having improved glass transition temperature and volatility.

This object is achieved by an organic light emitting diode comprising an anode electrode, a cathode electrode, at least one emission layer and an organic semiconductor layer, wherein the organic semiconductor layer is arranged between the anode electrode and the cathode electrode and the organic semiconductor layer comprises an alkali organic complex and a compound of formula 1

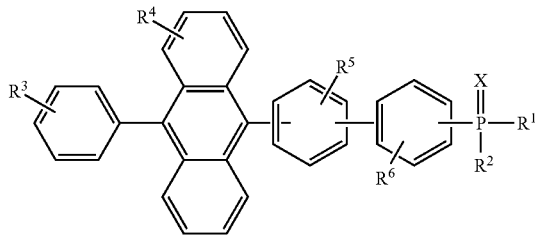

Formula 1 wherein
X is selected from O, S or Se; and
$R^1$ and $R^2$ are independently selected from the group consisting of $C_6$ to $C_{18}$ aryl group and $C_5$ to $C_{18}$ heteroaryl group, wherein each of $R^1$ and $R^2$ may independently be unsubstituted or substituted with at least one $C_1$ to $C_{12}$ alkyl group or $C_1$ to $C_{12}$ alkoxy group, preferably $C_1$ to $C_4$ alkyl group or $C_1$ to $C_4$ alkoxy group; and
each $R^3$, $R^4$, $R^5$, and $R^6$ are independently selected from the group consisting of H, $C_1$ to $C_{12}$ alkyl group or $C_1$ to $C_{12}$ alkoxy group, preferably H, $C_1$ to $C_4$ alkyl group or $C_1$ to $C_4$ alkoxy group.

According to another aspect, an organic light emitting diode is provided comprising an anode electrode, a cathode electrode, at least one emission layer and an organic semiconductor layer, wherein the organic semiconductor layer is arranged between the anode electrode and the cathode electrode and the organic semiconductor layer consists of an alkali organic complex and a compound of formula 1

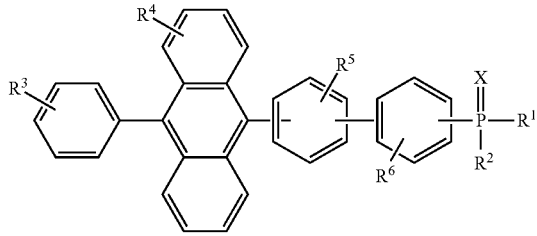

Formula 1 wherein
X is selected from O, S or Se; and
$R^1$ and $R^2$ are independently selected from the group consisting of $C_6$ to $C_{18}$ aryl group and $C_5$ to $C_{18}$ heteroaryl group, wherein each of $R^1$ and $R^2$ may independently be unsubstituted or substituted with at least one $C_1$ to $C_{12}$ alkyl group or $C_1$ to $C_{12}$ alkoxy group, preferably $C_1$ to $C_4$ alkyl group or $C_1$ to $C_4$ alkoxy group; and
each $R^3$, $R^4$, $R^5$, and $R^6$ are independently selected from the group consisting of H, $C_1$ to $C_{12}$ alkyl group or $C_1$ to $C_{12}$ alkoxy group, preferably H, $C_1$ to $C_4$ alkyl group or $C_1$ to $C_4$ alkoxy group.

Preferably, the organic semiconductor layer of the present invention is a non-emissive layer. Likewise, it is preferred that the compound of formula 1 comprised in the organic semiconductor layer is non-emissive in the visible region of the electromagnetic spectrum, which are wavelengths of about ≥380 nm to about ≤780 nm.

In terms of the invention, the compound of formula 1 has the following structure. The compound of formula 1 comprises a phenyl moiety to which one or more $R^3$ groups may be attached. Adjacent to the phenyl group is an anthracenylene group to which one or more groups R⁴ may be attached. The anthracenylene group is further connected with a biphenylene group. The biphenylene group consists of two phenylene rings one of which is substituted with one or more R⁵ groups and the other one is substituted with one or more R⁶ groups. The second ring of the biphenylene group (to which the anthracenylene group is not connected) is connected with the phosphorous containing group (P(X)R¹R²).

The compound of formula 1 may also be described as polar compound. The compound of formula 1 preferably has a dipole moment >2.5 and ≤10 Debye.

The term "alkyl" as used herein shall encompass linear as well as branched and cyclic alkyl. For example, $C_3$-alkyl may be selected from n-propyl and iso-propyl. Likewise, $C_4$-alkyl encompasses n-butyl, sec-butyl and t-butyl. Likewise, $C_6$-alkyl encompasses n-hexyl and cyclohexyl.

The subscribed number n in $C_n$ relates to the total number of carbon atoms in the respective alkyl, aryl, heteroaryl or alkoxy group.

The term "aryl" as used herein shall encompass phenyl ($C_6$-aryl), fused aromatics, such as naphthalene, anthracene, phenanthracene, tetracene etc. Further encompassed are biphenyl and oligo- or polyphenyls, such as terphenyl etc. Further encompassed shall be any further aromatic hydrocarbon substituents, such as fluorenyl etc. Arylene refers to groups to which two further moieties are attached.

The term "heteroaryl" as used herewith refers to aryl groups in which at least one carbon atom is substituted by a heteroatom, preferably selected from N, O, S, B or Si. Heteroarylene refers to groups to which two further moieties are attached.

The subscribed number n in $C_n$-heteroaryl merely refers to the number of carbon atoms excluding the number of heteroatoms. In this context, it is clear that a $C_5$ heteroarylene group is an aromatic compound comprising five carbon atoms, such as pyridyl.

In a most preferred embodiment all of R³, R⁴, R⁵ and R⁶ are H. In this way, a particular simple synthesis of the compounds is provided.

Furthermore, it is preferred that X is selected as O. In this case, improved performance over respective compounds with X=S or Se is observed.

Preferably, in the compound of formula 1 the biphenylene group is attached to the adjacent phosphorous containing group and/or the adjacent anthracenylene group in meta-position. A particularly beneficial effect on performance was observed for a biphenylene group which contains at least one meta-linked phenylene group. Exemplary and preferred "meta-substituted" compounds are MX2, MX3 and MX4 as described below.

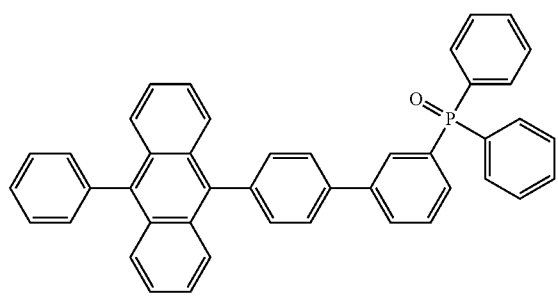

MX2

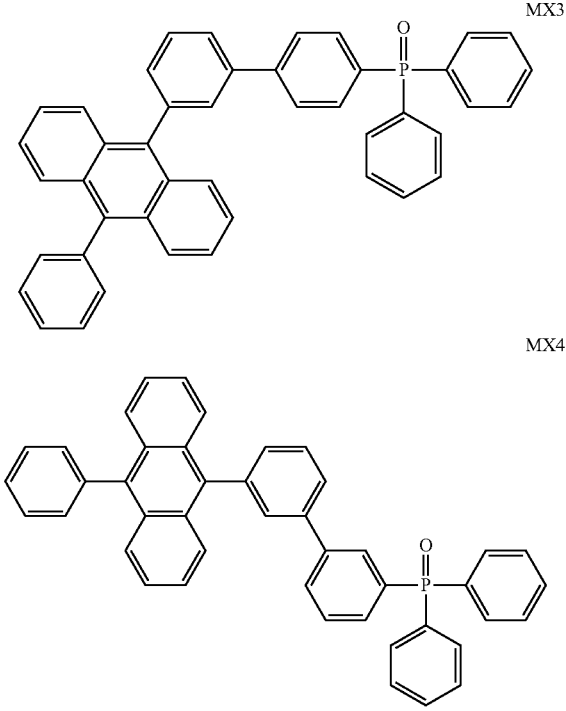

MX3

MX4

It is further preferred that the organic semiconductor layer is arranged between the emission layer and the cathode electrode, preferably the organic semiconductor layer is in direct contact with the cathode electrode. The benefit of this arrangement is that no injection layer is required to ensure efficient electron injection from the cathode electrode into the organic semiconductor layer of the present invention. Thereby, one layer less has to be deposited during manufacturing of the OLED. This constitutes are significant saving in terms of takt time and materials costs.

Preferably, the organic semiconductor layer is free of an emitter dopant and/or a metal dopant. Preferably, the organic semiconductor layer comprises one alkali organic complex.

Likewise, it is preferred that the organic light emitting diode further comprises a hole blocking layer and the organic semiconductor layer is arranged between the hole blocking layer and the cathode electrode.

Furthermore, it is preferred that the organic light emitting diode further comprises a charge generation layer, wherein the charge generation layer preferably comprises an n-type charge generation layer and a p-type charge generation layer and wherein the organic semiconductor layer is preferably in direct contact with the n-type charge generation layer.

In a preferred embodiment, the OLED comprises a first organic semiconductor layer comprising an alkali organic complex and a compound of formula 1 in direct contact with the n-type charge generation layer and a second organic semiconductor layer comprising an alkali organic complex and a compound of formula 1 arranged between the cathode electrode and the emission layer furthest away from the anode electrode.

According to various embodiments of the OLED of the present invention the thicknesses of the organic semiconductor layer can be in the range of about ≥20 nm to about ≤100 nm, preferably of about ≥30 nm to about ≤80 nm, further preferred of about ≥35 nm to about ≤60 nm, and more preferred of about ≥25 nm to about ≤40 nm.

The most preferred compounds according to Formula 1 are as follows

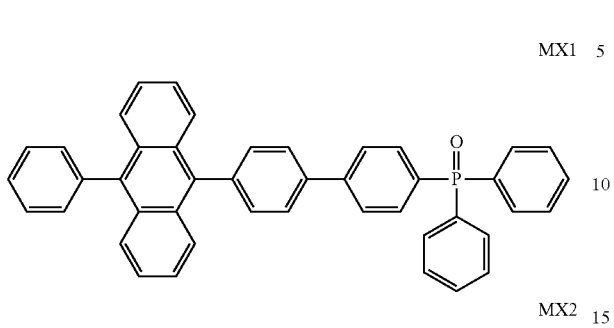

MX1

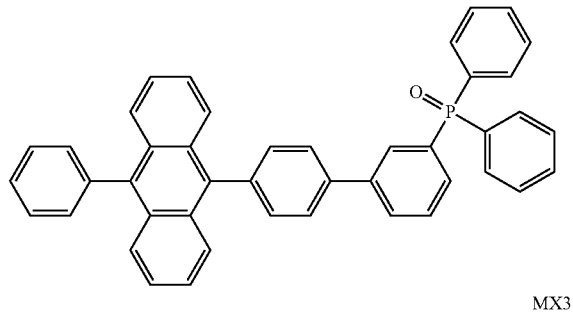

MX2

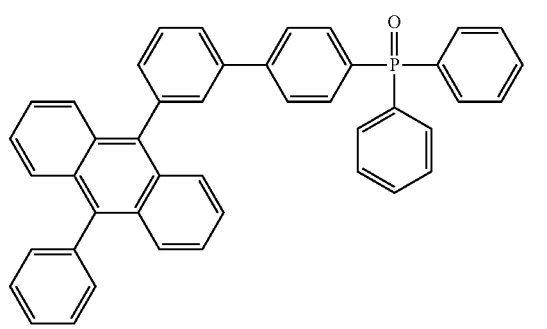

MX3

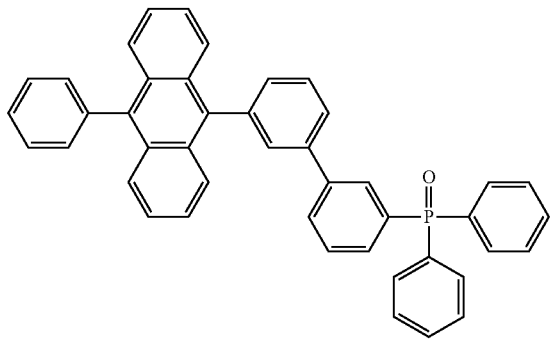

MX4

In these preferred OLED arrangements best performance of the compound of formula 1 is observed.

Alkali Organic Complex

With respect to the alkali organic complex comprised in the inventive light emitting diode, it is preferred that the alkali organic complex is a lithium organic complex, preferably selected from lithium 8-hydroxyquinolate and lithium borate preferably lithium tetra(1H-pyrazol-1-yl)borate, or mixtures thereof.

Suitable organic ligands to form a lithium organic complex that can be used for the electron transport layer are disclosed, for example, in US 2014/0048792 and Kathiramanathan, Poopathy, Arkley, Vincent; Surendrakumar, Sivagnanassmdram; Chan, Yun F.; Ravichandran, Seenivasagam; Ganeshamurugan, Subramaniam; Kumaraverl, Muttulingam; AntipanLara, Juan; Paramaswara, Gnanamolly, Reddy, Vanga R., Digest of Technical Papers—Society for Information Display International Symposium (2010), 41(Bk. 1), 465-468.

Particularly preferred lithium organic complexes are shown in Table 1.

TABLE 1

Lithium organic complex that can be suitable used in the organic semiconductive layer

| Referred to as: | Name | Structure | Publication |
|---|---|---|---|
| LiQ | lithium 8-hydroxyquinolate | | WO 2013079217A1 |
| Li-1 | lithium tetra(1H-pyrazol-1-yl)borate | | WO 2013079676A1 |

TABLE 1-continued

Lithium organic complex that can be suitable used in the organic semiconductive layer

| Referred to as: | Name | Structure | Publication |
|---|---|---|---|
| Li-2 | lithium 2-(diphenylphosphoryl)phenolate | | WO 2013079678A1 |
| Li-3 | lithium 2-(pyridin-2-yl)phenolate | | JP 2008195623 |
| Li-4 | lithium 2-(1-phenyl-1H-benzo[d]imidazol-2-yl)phenolate | | JP 2001291593, |
| Li-5 | lithium 2-(benzo[d]oxazol-2-yl)phenolate | | US 20030165711 |
| Li-6 | lithium 2-(diphenylphosphoryl)pyridin-3-olate | | EP 2724388 |

The organic ligand of the lithium organic complex of the organic semiconductive layer may be selected from the group comprising a quinolate, a borate, a phenolate, a pyridinolate or a Schiff base ligand, or Table 1;

preferably the lithium quinolate complex has the formula I, II, or III:

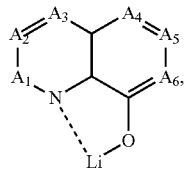
(I)

-continued

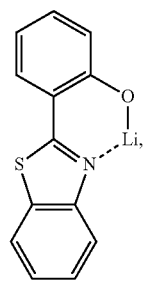
(II)

-continued

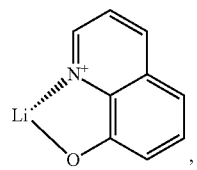
(III)

wherein
A₁ to A₆ are same or independently selected from CH, CR, N, O;
R is same or independently selected from hydrogen, halogen, alkyl or aryl or heteroaryl with 1 to 20 carbon atoms; and more preferred $A_1$ to $A_6$ are CH;
preferably the borate based organic ligand is a tetra (1H-pyrazol-1-yl)borate;
preferably the phenolate is a 2-(pyridin-2-yl)phenolate or a 2-(diphenylphosphoryl)phenolate;
preferably the lithium Schiff base has the structure 100, 101, 102 or 103:

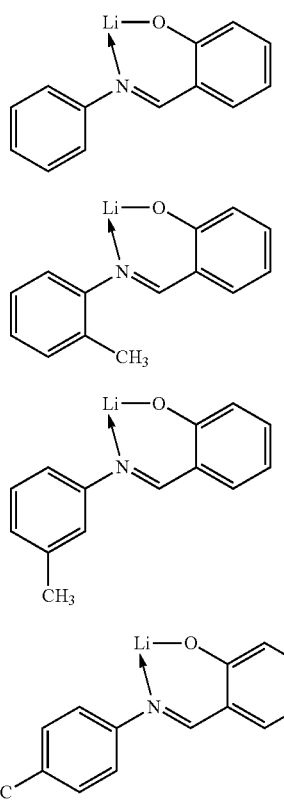

more preferred the lithium organic complex is selected from a compound of Table 1.

Preferably, the alkali organic complex is essentially non-emissive in the visible region of the electromagnetic spectrum, which are wavelengths of about ≥380 nm to about ≤780 nm.

In the context of the present specification the term "essentially non-emissive" means that the contribution of the non-light-emitting dopant to the emission spectrum from the device is less than 10%, preferably less than 5% relative to the emission spectrum.

The alkali organic complex may emit in the ultraviolet region of the electromagnetic spectrum.

In the present invention, the following defined terms, these definitions shall be applied, unless a different definition is given in the claims or elsewhere in this specification.

In the context of the present specification the term "different" or "differs" in connection with the matrix material means that the matrix material differs in their structural formula.

In the context of the present specification the term "different" or "differs" in connection with the lithium compound means that the lithium compound differs in their structural formula.

The term "free of", "does not contain", "does not comprise" does not exclude impurities which may be present in the compounds prior to deposition. Impurities have no technical effect with respect to the object achieved by the present invention.

Vacuum thermal evaporation, also named VTE, describes the process of heating a compound in a VTE source and evaporating said compound from the VTE source under reduced pressure.

The rate onset temperature is measured in ° C. and describes the VTE source temperature at which measurable evaporation of a compound commences at a pressure of less than $10^{-5}$ mbar.

The glass transition temperature, also named Tg, is measured in ° C. and determined by Differential Scanning Calorimetry (DSC).

The external quantum efficiency, also named EQE, is measured in percent (%).

The lifetime, also named LT, between starting brightness and 97% of the original brightness is measured in hours (h).

The operating voltage, also named V, is measured in Volt (V) at 10 milliAmpere per square centimeter (mA/cm²) in bottom emission devices and at 15 mA/cm² in top emission devices.

The color space is described by coordinates CIE-x and CIE-y (International Commission on Illumination 1931). For blue emission the CIE-y is of particular importance. A smaller CIE-y denotes a deeper blue color.

The highest occupied molecular orbital, also named HOMO, and lowest unoccupied molecular orbital, also named LUMO, are measured in electron volt (eV).

The terms "OLED" and "organic electroluminescent device", "organic light-emitting diode" and "organic light emitting diode" are simultaneously used and have the same meaning.

As used herein, "weight percent", "wt.-%", "percent by weight", "% by weight", and variations thereof refer to a composition, component, substance or agent as the weight of that component, substance or agent of the respective electron transport layer divided by the total weight of the respective electron transport layer thereof and multiplied by 100. It is understood that the total weight percent amount of all components, substances and agents of the respective organic semiconductor layer are selected such that it does not exceed 100 wt.-%.

As used herein, "volume percent", "vol.-%", "percent by volume", "% by volume", and variations thereof refer to a composition, component, substance or agent as the volume of that component, substance or agent of the respective electron transport layer divided by the total volume of the respective electron transport layer thereof and multiplied by 100. It is understood that the total volume percent amount of all components, substances and agents of the cathode layer are selected such that it does not exceed 100 vol.-%.

All numeric values are herein assumed to be modified by the term "about", whether or not explicitly indicated. As used herein, the term "about" refers to variation in the numerical quantity that can occur. Whether or not modified by the term "about" the claims include equivalents to the quantities.

It should be noted that, as used in this specification and the appended claims, the singular forms "a", "an", and "the" include plural referents unless the content clearly dictates otherwise.

Herein, when a first element is referred to as being formed or disposed "on" a second element, the first element can be disposed directly on the second element or one or more other elements may be disposed there between. When a first element is referred to as being formed or disposed "directly on" a second element, no other elements are disposed there between.

The term "contacting sandwiched" refers to an arrangement of three layers whereby the layer in the middle is in direct contact with the two adjacent layers.

The anode electrode and cathode electrode may be described as anode electrode/cathode electrode or anode electrode/cathode electrode or anode electrode layer/cathode electrode layer.

The organic light emitting diode according to the invention may comprise the following constituents. In this regard, the respective constituents may be as follows.

Substrate

The substrate may be any substrate that is commonly used in manufacturing of organic light-emitting diodes. If light is emitted through the substrate, the substrate may be a transparent material, for example a glass substrate or a transparent plastic substrate, having excellent mechanical strength, thermal stability, transparency, surface smoothness, ease of handling, and waterproofness. If light is emitted through the top surface, the substrate may be a transparent or non-transparent material, for example a glass substrate, a plastic substrate, a metal substrate or a silicon substrate.

Anode Electrode

The anode electrode may be formed by depositing or sputtering a compound that is used to form the anode electrode. The compound used to form the anode electrode may be a high work-function compound, so as to facilitate hole injection. The anode material may also be selected from a low work function material (i.e. Aluminum). The anode electrode may be a transparent or reflective electrode. Transparent conductive compounds, such as indium tin oxide (ITO), indium zinc oxide (IZO), tin-dioxide ($SnO_2$), and zinc oxide (ZnO), may be used to form the anode electrode 120. The anode electrode 120 may also be formed using magnesium (Mg), aluminum (Al), aluminum-lithium (Al—Li), calcium (Ca), magnesium-indium (Mg—In), magnesium-silver (Mg—Ag), silver (Ag), gold (Au), or the like.

Cathode Electrode

In a further preferred embodiment, the cathode electrode comprises at least one substantially metallic cathode layer comprising a first zero-valent metal selected from the group consisting of alkali metal, alkaline earth metal, rare earth metal, group 3 transition metal and mixtures thereof.

The term "substantially metallic" shall be understood as encompassing a metal which is at least partially in a substantially elemental form. The term substantially elemental is to be understood as a form that is, in terms of electronic states and energies and in terms of chemical bonds of comprised metals atoms closer to the form of an elemental metal, or a free metal atom or to the form of a cluster of metal atoms, then to the form of a metal salt, of an organometallic metal compound or another compound comprising a covalent bond between metal and non-metal, or to the form of a coordination compound of a metal.

It is to be understood that metal alloys beside neat elemental metals, atomized metals, metal molecules and metal clusters, any other example of substantially elemental form of metals. These exemplary representatives of substantially metallic forms are the preferred substantially metallic cathode layer constituents.

Particularly low operating voltage and high manufacturing yield may be obtained when the first zero-valent metal is selected from this group.

According to another aspect there is provided an organic light emitting diode wherein the substantially metallic cathode layer is free of a metal-halide and/or free of a metal organic complex.

According to a preferred embodiment, the substantially metallic cathode electrode layer comprises or consists of the first zero-valent metal. In particularly preferred embodiments, the substantially metallic cathode layer further comprises a second zero-valent metal, wherein the second zero-valent metal is selected from a main group metal or a transition metal; and wherein the second zero-valent metal is different from the first zero-valent metal.

In this regard, it is further preferred that the second zero-valent metal is selected from the group consisting of Li, Na, K, Cs, Mg, Ca, Sr, Ba, Sc, Y, Ti, V, Cr, Mn, Fe, Co, Ni, Cu, Zn, Ag, Au, Al, Ga, In, Sn, Te, Bi, Pb and mixtures thereof, preferably the second zero-valent metal is selected from the group consisting of Ag, Au, Zn, Te, Yb, Ga, Bi, Ba, Ca, Al and mixtures thereof; and most preferred the second zero-valent metal is selected from the group consisting of Ag, Zn, Te, Yb, Ga, Bi and mixtures thereof.

The second zero-valent metal may improve reliability of the deposition process and mechanical stability of the deposited layer and thereby improve manufacturing yield when selected from this list. Additionally, the second zero-valent metal may improve reflectivity of the first cathode electrode layer.

According to a preferred embodiment the substantially metallic cathode layer can comprises at least about ≥15 vol.-% to about ≤99 vol.-% of the first zero-valent metal and less than about ≥85 vol.-% to about ≤1 vol.-% of the second zero-valent metal; preferably ≥15 vol.-% to about ≤95 vol.-% of the first zero-valent metal and less than about ≥85 vol.-% to about ≤5 vol.-% of the second zero-valent metal; more preferred ≥20 vol.-% to about ≤90 vol.-% of the first zero-valent metal and less than about ≥80 vol.-% to about ≤10 vol.-% of the second zero-valent metal; also preferred ≥15 vol.-% to about ≤80 vol.-% of the first zero-valent metal and less than about ≥85 vol.-% to about ≤20 vol.-% of the second zero-valent metal.

Particularly preferred the substantially metallic cathode layer comprises at least about ≥20 vol.-% to about ≤85 vol.-% of the first zero-valent metal, selected from Mg and less than about ≥80 vol.-% to about ≤15 vol.-% of the second zero-valent metal selected from Ag.

The first zero-valent metal may enable efficient electron injection from the cathode. The second zero-valent metal may stabilize the cathode layer and/or increase yield of the cathode deposition step and/or increase transparency or reflectivity of the cathode.

In a further preferred embodiment, the substantially metallic cathode layer comprised in the cathode electrode is a first cathode layer and the cathode electrode further comprises a second cathode layer, wherein the first cathode layer is arranged closer to the organic semiconductor layer and the second cathode layer is arranged further away from the organic semiconductor layer and wherein the second cathode layer comprising at least one third metal in form of a zero-valent metal, an alloy, an oxide or a mixture thereof, wherein the third metal is selected from a main group metal, transition metal, rare earth metal or mixtures thereof, preferably the third metal is selected from zero-valent Ag, Al, Cu, Au, MgAg alloy, indium tin oxide, indium zinc oxide, ytterbium oxide, indium gallium zinc oxide and more preferred the third metal is selected from Ag, Al, or MgAg alloy; and most preferred the third metal is selected from zero-valent Ag or Al.

The second cathode electrode layer may protect the first cathode electrode layer from the environment. Additionally it may enhance outcoupling of light emission in devices when light is emitted through the cathode electrode.

The thickness of the first cathode electrode layer may be in the range of about 0.2 nm to 100 nm, preferably 1 to 50 nm. If no second cathode electrode layer is present, the thickness of the first cathode electrode layer may be in the range of 1 to 25 nm. If a second cathode electrode layer is present, the thickness of the first cathode electrode layer may be in the range of 0.2 to 5 nm.

The thickness of the second cathode electrode layer may be in the range of 0.5 to 500 nm, preferably 10 to 200 nm, even more preferred 50 to 150 nm.

When the thickness of the cathode electrode is in the range of 5 nm to 50 nm, the cathode electrode may be transparent even if a metal or metal alloy is used.

Hole Injection Layer

The hole injection layer (HIL) 130 may be formed on the anode electrode 120 by vacuum deposition, spin coating, printing, casting, slot-die coating, Langmuir-Blodgett (LB) deposition, or the like. When the HIL 130 is formed using vacuum deposition, the deposition conditions may vary according to the compound that is used to form the HIL 130, and the desired structure and thermal properties of the HIL 130. In general, however, conditions for vacuum deposition may include a deposition temperature of 100° C. to 500° C., a pressure of $10^{-8}$ to $10^{-3}$ Torr (1 Torr equals 133.322 Pa), and a deposition rate of 0.1 to 10 nm/sec.

When the HIL 130 is formed using spin coating, printing, coating conditions may vary according to a compound that is used to form the HIL 130, and the desired structure and thermal properties of the HIL 130. For example, the coating conditions may include a coating speed of about 2000 rpm to about 5000 rpm, and a thermal treatment temperature of about 80° C. to about 200° C. Thermal treatment removes a solvent after the coating is performed.

The HIL 130 may be formed of any compound that is commonly used to form an HIL. Examples of compounds that may be used to form the HIL 130 include a phthalocyanine compound, such as copper phthalocyanine (CuPc), 4,4',4"-tris (3-methylphenylphenylamino) triphenylamine (m-MTDATA), TDATA, 2T-NATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and polyaniline)/poly(4-styrenesulfonate (PANI/PSS).

The HIL 130 may be a pure layer of p-dopant or may be selected from a hole-transporting matrix compound doped with a p-dopant. Typical examples of known redox doped hole transport materials are: copper phthalocyanine (CuPc), which HOMO level is approximately −5.2 eV, doped with tetrafluoro-tetracyanoquinonedimethane (F4TCNQ), which LUMO level is about −5.2 eV; zinc phthalocyanine (ZnPc) (HOMO=−5.2 eV) doped with F4TCNQ; α-NPD (N,N'-Bis (naphthalen-1-yl)-N,N'-bis(phenyl)-benzidine) doped with F4TCNQ. α-NPD doped with 2,2'-(perfluoronaphthalen-2, 6-diylidene) dimalononitrile (PD1). α-NPD doped with 2,2', 2"-(cyclopropane-1,2,3-triylidene)tris(2-(p-cyanotetrafluorophenyl)acetonitrile) (PD2). Dopant concentrations can be selected from 1 to 20 wt.-%, more preferably from 3 wt.-% to 10 wt.-%.

The thickness of the HIL 130 may be; in the range of about 1 nm to about 100 nm, and for example, about 1 nm to about 25 nm. When the thickness of the HIL 130 is within this range, the HIL 130 may have excellent hole injecting characteristics, without a substantial increase in driving voltage.

Hole Transport Layer

The hole transport layer (HTL) 140 may be formed on the HIL 130 by vacuum deposition, spin coating, slot-die coating, printing, casting, Langmuir-Blodgett (LB) deposition, or the like. When the HTL 140 is formed by vacuum deposition or spin coating, the conditions for deposition and coating may be similar to those for the formation of the HIL 130. However, the conditions for the vacuum or solution deposition may vary, according to the compound that is used to form the HTL 140.

The HTL 140 may be formed of any compound that is commonly used to form a HTL. Compound that can be suitably used is disclosed for example in Yasuhiko Shirota and Hiroshi Kageyama, Chem. Rev. 2007, 107, 953-1010 and incorporated by reference. Examples of the compound that may be used to form the HTL 140 are: a carbazole derivative, such as N-phenylcarbazole or polyvinylcarbazole; an amine derivative having an aromatic condensation ring, such as N,N'-bis(3-methylphenyl)-N,N'-diphenyl-[1,1-biphenyl]-4,4'-diamine (TPD), or N,N'-di(naphthalen-1-yl)-N,N'-diphenyl benzydine (alpha-NPD); and a triphenylamine-based compound, such as 4,4',4"-tris(N-carbazolyl) triphenylamine (TCTA). Among these compounds, TCTA can transport holes and inhibit excitons from being diffused into the EML.

The thickness of the HTL 140 may be in the range of about 5 nm to about 250 nm, preferably, about 10 nm to about 200 nm, further about 20 nm to about 190 nm, further about 40 nm to about 180 nm, further about 60 nm to about 170 nm, further about 80 nm to about 160 nm, further about 100 nm to about 160 nm, further about 120 nm to about 140 nm. A preferred thickness of the HTL 140 may be 170 nm to 200 nm.

When the thickness of the HTL 140 is within this range, the HTL 140 may have excellent hole transporting characteristics, without a substantial increase in driving voltage.

Electron Blocking Layer

The function of the electron blocking layer (EBL) 150 is to prevent electrons from being transferred from the emission layer to the hole transport layer and thereby confine electrons to the emission layer. Thereby, efficiency, operating voltage and/or lifetime are improved. Typically, the electron blocking layer comprises a triarylamine compound. The triarylamine compound may have a LUMO level closer to vacuum level than the LUMO level of the hole transport layer. The electron blocking layer may have a HOMO level that is further away from vacuum level compared to the HOMO level of the hole transport layer. The thickness of the electron blocking layer is selected between 2 and 20 nm.

The electron blocking layer may comprise a compound of formula Z below

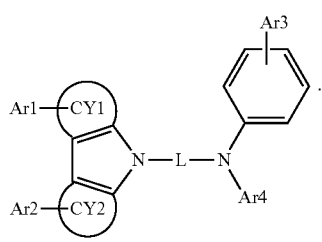

(Z)

In Formula Z,
CY1 and CY2 are the same as or different from each other, and each independently represent a benzene cycle or a naphthalene cycle,
Ar1 to Ar3 are the same as or different from each other, and each independently selected from the group consisting of hydrogen; a substituted or unsubstituted aryl group having 6 to 30 carbon atoms; and a substituted or unsubstituted heteroaryl group having 5 to 30 carbon atoms,
Ar4 is selected from the group consisting of a substituted or unsubstituted phenyl group, a substituted or unsubstituted biphenyl group, a substituted or unsubstituted terphenyl group, a substituted or unsubstituted triphenylene group, and a substituted or unsubstituted heteroaryl group having 5 to 30 carbon atoms,
L is a substituted or unsubstituted arylene group having 6 to 30 carbon atoms.

If the electron blocking layer has a high triplet level, it may also be described as triplet control layer.

The function of the triplet control layer is to reduce quenching of triplets if a phosphorescent green or blue emission layer is used. Thereby, higher efficiency of light emission from a phosphorescent emission layer can be achieved. The triplet control layer is selected from triarylamine compounds with a triplet level above the triplet level of the phosphorescent emitter in the adjacent emission layer. Suitable triplet control layer, in particular the triarylamine compounds, are described in EP 2 722 908 A1.

Emission Layer (EML)

The EML 150 may be formed on the HTL by vacuum deposition, spin coating, slot-die coating, printing, casting, LB, or the like. When the EML is formed using vacuum deposition or spin coating, the conditions for deposition and coating may be similar to those for the formation of the HIL. However, the conditions for deposition and coating may vary, according to the compound that is used to form the EML.

The emission layer (EML) may be formed of a combination of a host and a dopant. Example of the host are Alq3, 4,4'-N,N'-dicarbazole-biphenyl (CBP), poly(n-vinylcarbazole) (PVK), 9,10-di(naphthalene-2-yl)anthracene (ADN), 4,4',4"-Tris(carbazol-9-yl)-triphenylamine (TCTA), 1,3,5-tris(N-phenylbenzimidazole-2-yl)benzene (TPBI), 3-tert-butyl-9,10-di-2-naphthylanthracenee (TBADN), distyrylarylene (DSA), Bis(2-(2-hydroxyphenyl)benzothiazolate)zinc (Zn(BTZ) 2), E3 below, AND, Compound 1 below, and Compound 2 below.

E3

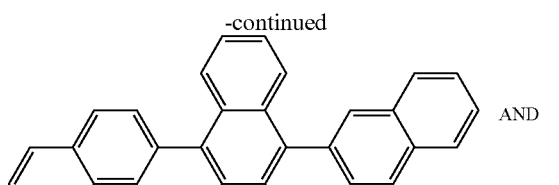

AND

Compound 1

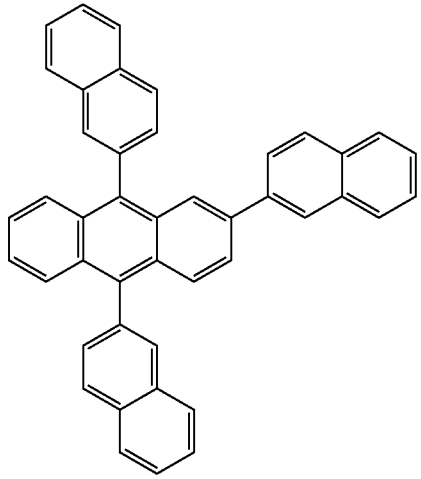

Compound 2

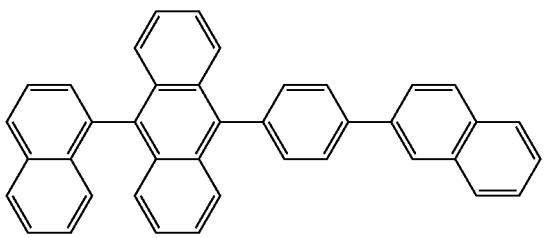

The dopant may be a phosphorescent or fluorescent emitter. Phosphorescent emitters and emitters which emit light via a thermally activated delayed fluorescence (TADF) mechanism are preferred due to their higher efficiency. The emitter may be a small molecule or a polymer.

Examples of a red dopant are PtOEP, Ir(piq) 3, and Btp 2Ir(acac), but are not limited thereto. These compounds are phosphorescent emitters, however, fluorescent red dopants could also be used.

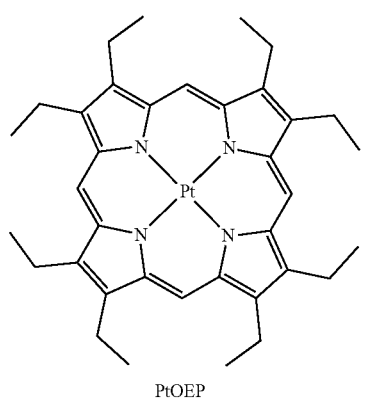

PtOEP

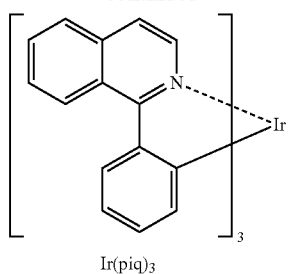

Ir(piq)₃

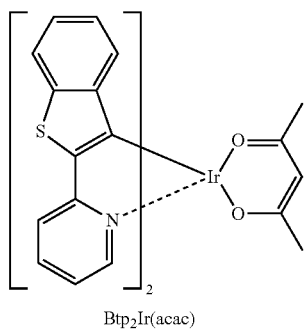

Btp₂Ir(acac)

Examples of a phosphorescent green dopant are Ir(ppy) 3 (ppy=phenylpyridine), Ir(ppy) 2(acac), Ir(mpyp) 3 are shown below. Compound 3 is an example of a fluorescent green emitter and the structure is shown below.

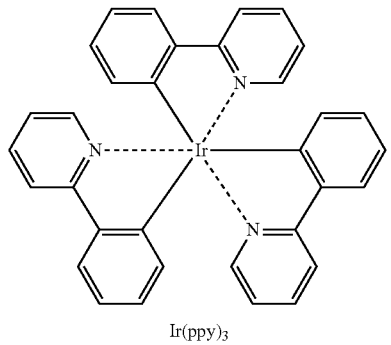

Ir(ppy)₃

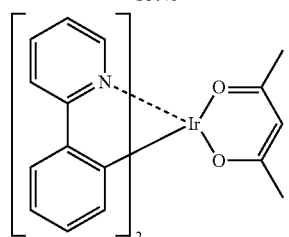

Ir(ppy)₂(acac)

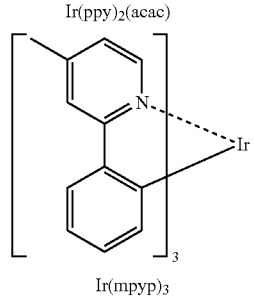

Ir(mpyp)₃

Compound 3

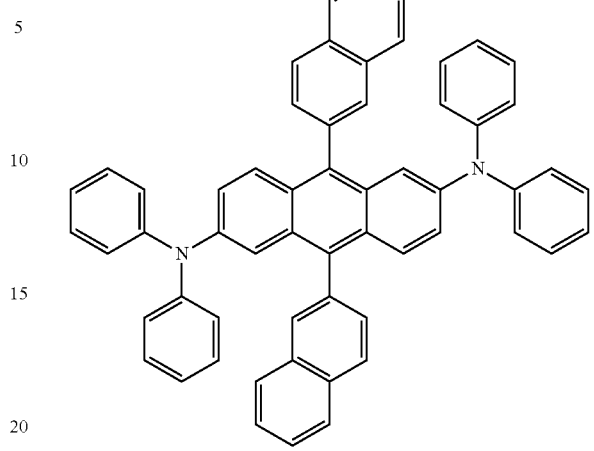

Examples of a phosphorescent blue dopant are F₂Irpic, (F₂ppy)₂Ir(tmd) and Ir(dfppz) 3, terfluorene, the structures are shown below. 4,4'-bis(4-diphenyl amiostyryl)biphenyl (DPAVBi), 2,5,8,11-tetra-tert-butyl perylene (TBPe), and Compound 4 below are examples of fluorescent blue dopants.

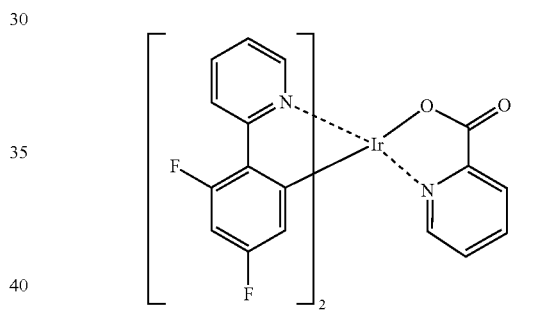

F₂Irpic

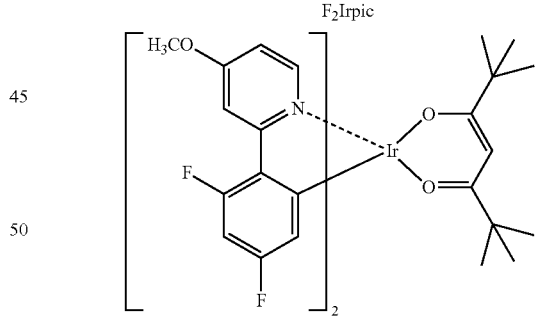

(F₂ppy)₂Ir(tmd)

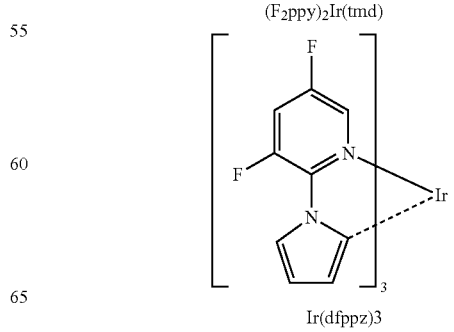

Ir(dfppz)3

Compound 4

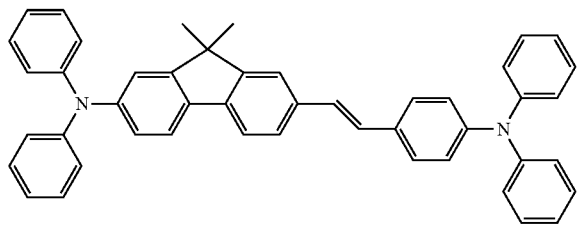

The amount of the dopant may be in the range of about 0.01 to about 50 parts by weight, based on 100 parts by weight of the host. Alternatively, the emission layer may consist of a light-emitting polymer. The EML may have a thickness of about 10 nm to about 100 nm, for example, about 20 nm to about 60 nm. When the thickness of the EML is within this range, the EML may have excellent light emission, without a substantial increase in driving voltage.

Hole Blocking Layer (HBL)

When the EML comprises a phosphorescent dopant, a hole blocking layer (HBL) may be formed on the EML, by using vacuum deposition, spin coating, slot-die coating, printing, casting, LB deposition, or the like, in order to prevent the diffusion of triplet excitons or holes into the ETL.

When the HBL is formed using vacuum deposition or spin coating, the conditions for deposition and coating may be similar to those for the formation of the HIL. However, the conditions for deposition and coating may vary, according to the compound that is used to form the HBL. Any compound that is commonly used to form a HBL may be used. Examples of compounds for forming the HBL include an oxadiazole derivative, a triazole derivative, and a phenanthroline derivative.

The HBL may have a thickness of about 5 nm to about 100 nm, for example, about 10 nm to about 30 nm. When the thickness of the HBL is within this range, the HBL may have excellent hole-blocking properties, without a substantial increase in driving voltage.

Electron Transport Layer

The OLED according to the present invention may optional contain an electron transport layer (ETL).

According to various embodiments the OLED may comprises an electron transport layer or an electron transport layer stack comprising at least a first electron transport layer and at least a second electron transport layer.

According to various embodiments of the OLED of the present invention the electron transport layer may comprises at least one matrix compound. Preferably, the matrix compound is an organic compound. More preferably the matrix compound is a covalent organic matrix compound. In other words, the matrix compound comprises covalent bonds. It is to be understood that "substantially covalent" means compounds comprising elements bound together mostly by covalent bonds.

According to another aspect, an organic light emitting diode is provided, wherein an electron transport layer is arranged between the emission layer and the organic semiconductor layer of the present invention. Preferably, the electron transport layer is in direct contact with the emission layer and the organic semiconductor layer is contacting sandwiched between the electron transport layer and the cathode electrode.

Preferably, the electron transport layer is free of emitter dopants and/or alkali organic complexes.

According to another aspect, the electron transport layer comprises a first organic matrix compound.

According to a more preferred aspect the first organic matrix compound is selected from the group comprising benzo[k]fluoranthene, pyrene, anthracene, fluorene, spiro (bifluorene), phenanthrene, perylene, triptycene, spiro[fluorene-9,9'-xanthene], coronene, triphenylene, xanthene, benzofurane, dibenzofurane, dinaphthofurane, acridine, benzo[c]acridine, dibenzo[c,h]acridine, dibenzo[a,j]acridine, triazine, pyridine, pyrimidine, carbazole, phenyltriazole, benzimidazole, phenanthroline, oxadiazole, benzooxazole, oxazole, quinazoline, benzo[h]quinazoline, pyrido[3,2-h]quinazoline, pyrimido[4,5-f]quinazoline, quinoline, benzoquinoline, pyrrolo[2,1-a]isoquinolin, benzofuro[2,3-d]pyridazine, thienopyrimidine, dithienothiophene, benzothienopyrimidine, benzothienopyrimidine, phosphine oxide, phosphole, triaryl borane, 2-(benzo[d]oxazol-2-yl) phenoxy metal complex, 2-(benzo[d]thiazol-2-yl)phenoxy metal complex or mixtures thereof.

The electron transport layer may preferably comprise a first organic matrix compound with a dipole moment of about ≥0 Debye and about ≤2.5 Debye, preferably ≥0 Debye and <2.3 Debye, more preferably ≥0 Debye and <2 Debye. The first organic matrix compound may also be described as non-polar organic matrix compound.

The dipole moment $|\vec{\mu}|$ of a molecule containing N atoms is given by:

$$\vec{\mu} = \sum_i^N q_i \vec{r_i}$$

$$|\vec{\mu}| = \sqrt{\mu_x^2 + \mu_y^2 + \mu_z^2}$$

wherein $q_i$ and $\vec{r_i}$ are the partial charge and position of atom i in the molecule. The dipole moment is determined by a semi-empirical molecular orbital method. The values in Table 5 were calculated using the method as described below. The partial charges and atomic positions are obtained using either the DFT functional of Becke and Perdew BP with a def-SV(P) basis or the hybrid functional B3LYP with a def2-TZVP basis set as implemented in the program package TURBOMOLE V6.5. If more than one conformation is viable, the conformation with the lowest total energy is selected to determine the dipole moment.

For example, the first organic matrix compound may have a dipole moment of about ≥0 Debye and about ≤2.5 Debye, the first organic matrix compound may contain a center of inversion I, a horizontal mirror plane, more than one $C_n$ axis (n>1), and/or n $C_2$ perpendicular to $C_n$.

If the first organic matrix compound has a dipole moment of about ≥0 Debye and about ≤2.5 Debye, the first organic matrix compound may contain an anthracene group, a pyrene group, a perylene group, a coronene group, a benzo[k]fluoranthene group, a fluorene group, a xanthene group, a dibenzo[c,h]acridine group, a dibenzo[a,j]acridine group, a benzo[c]acridine group, a triaryl borane group, a dithienothiophene group, a triazine group or a benzothienopyrimidine group.

If the first organic matrix compounds has a dipole moment of about ≥0 Debye and about ≤2.5 Debye, the first organic matrix compound may be free of an imidazole group, a phenanthroline group, a phosphine oxide group, an oxazole group, an oxadiazole group, a triazole group, a pyrimidine group, a quinazoline group, a benzo[h]quinazoline group or a pyrido[3,2-h]quinazoline group.

In a preferred embodiment, the first organic matrix compound is selected from the following compounds or derivatives thereof, the compounds being anthracene, pyrene, coronene, triphenylene, fluorene, spiro-fluorene, xanthene, carbazole, dibenzo[c,h]acridine, dibenzo[a,j]acridine, benzo[c]acridine, triaryl borane compounds, 2-(benzo[d]oxazol-2-yl)phenoxy metal complex; 2-(benzo[d]thiazol-2-yl)phenoxy metal complex, triazine, benzothienopyrimidine, dithienothiophene, benzo[k]fluoranthene, perylene or mixtures thereof.

It may be further preferred that the first organic matrix compound comprises a triaryl borane compound of formula (1)

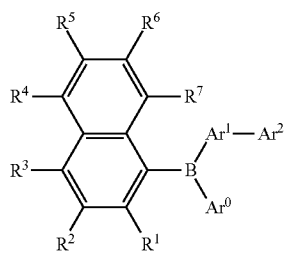

(1)

wherein $R^1$, $R^3$ and $R^7$ are independently selected from a group consisting of H, D, $C_1$-$C_{16}$ alkyl and $C_1$-$C_{16}$ alkoxy; $R^2$, $R^4$, $R^5$ and $R^6$ are independently selected from a group consisting of H, D, $C_1$-$C_{16}$ alkyl, $C_1$-$C_{16}$ alkoxy and $C_6$-$C_{20}$ aryl;
$Ar^0$ is selected from substituted or unsubstituted $C_6$-$C_{20}$ aryl, wherein, in case that $Ar^0$ is substituted, the substituents are independently selected from a group consisting of D, $C_1$-$C_{12}$ alkyl, $C_1$-$C_{16}$ alkoxy and $C_6$-$C_{20}$ aryl; and
$Ar^1$ is selected from substituted or unsubstituted $C_6$-$C_{20}$ arylene, wherein, in case that $Ar^1$ is substituted, the substituents are independently selected from a group consisting of D, $C_1$-$C_{12}$ alkyl, $C_1$-$C_6$ alkoxy and $C_6$-$C_{20}$ aryl; and
$Ar^2$ is selected from $Ar^2$ is selected from a group consisting of H, D, substituted or unsubstituted $C_6$-$C_{40}$ aryl and $C_5$-$C_{40}$ heteroaryl.

Preferably, $Ar^0$ is selected from substituted or unsubstituted phenyl or napthyl, wherein, in case that $Ar^0$ is substituted, the substituents are independently selected from a group consisting of D, $C_1$-$C_{12}$ alkyl, $C_1$-$C_{16}$ alkoxy and $C_6$-$C_{20}$ aryl.

Triaryl borane compounds of formula (1):

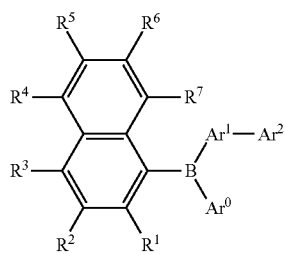

(1)

are disclosed in WO2015049030A2 and EP15187135.7.

In a further preferred embodiment, the first organic matrix compound comprises a dibenzo[c,h]acridine compound of formula (2)

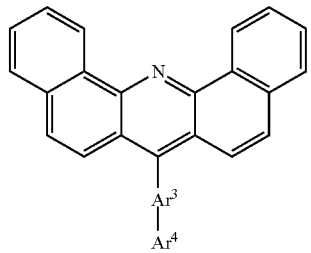

(2)

and/or a dibenzo[a,j]acridine compound of formula (3)

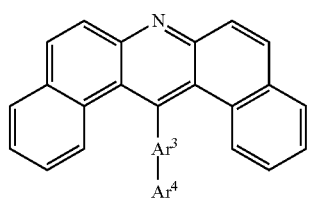

(3)

and/or a benzo[c]acridine compound of formula (4)

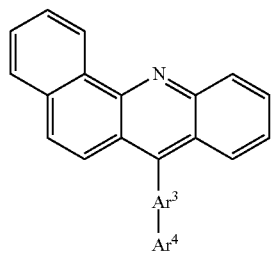

(4)

wherein $Ar^3$ is independently selected from $C_6$-$C_{20}$ arylene, preferably phenylene, biphenylene, or fluorenylene;
$Ar^4$ is independently selected from unsubstituted or substituted $C_6$-$C_{40}$ aryl, preferably phenyl, naphthyl, anthranyl, pyrenyl, or phenanthryl;
and in case that $Ar^4$ is substituted, the one or more substituents may be independently selected from the group consisting of $C_1$-$C_{12}$ alkyl and $C_1$-$C_{12}$ heteroalkyl, wherein $C_1$-$C_5$ alkyl is preferred.

Suitable dibenzo[c,h]acridine compounds are disclosed in EP 2 395 571. Suitable dibenzo[a,j]acridine are disclosed in EP 2 312 663. Suitable benzo[c]acridine compounds are disclosed in WO 2015/083948.

In a further embodiment, it is preferred that the first organic matrix compound comprises a dibenzo[c,h]acridine compound substituted with $C_6$-$C_{40}$ aryl, $C_5$-$C_{40}$ heteroaryl and/or $C_1$-$C_{12}$ alkyl groups, preferably 7-(naphthalen-2-yl)dibenzo[c,h]acridine, 7-(3-(pyren-1-yl)phenyl)dibenzo[c,h]acridine, 7-(3-(pyridin-4-yl)phenyl)dibenzo[c,h]acridine.

In a further embodiment, it is preferred that the first organic matrix compound comprises a dibenzo[a,j]acridine compound substituted with $C_6$-$C_{40}$ aryl, $C_5$-$C_{40}$ heteroaryl and/or $C_1$-$C_{12}$ alkyl groups, preferably 14-(3-(pyren-1-yl)phenyl)dibenzo[a,j]acridine.

In a further embodiment, it is preferred that the first organic matrix compound comprises a benzo[c]acridine compound substituted with $C_6$-$C_{40}$ aryl, $C_5$-$C_{40}$ heteroaryl and/or $C_1$-$C_{12}$ alkyl groups, preferably 7-(3-(pyren-1-yl)phenyl)benzo[c]acridine.

It may be further preferred that the first organic matrix compound comprises a triazine compound of formula (5)

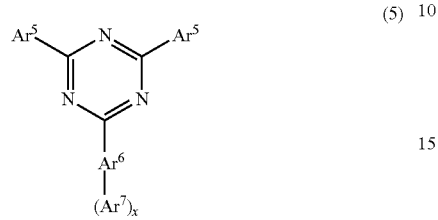

(5)

wherein $Ar^5$ is independently selected from unsubstituted or substituted $C_6$-$C_{20}$ aryl or $Ar^{5.1}$-$Ar^{5.2}$, wherein $Ar^{5.1}$ is selected from unsubstituted or substituted $C_6$-$C_{20}$ arylene and $Ar^{5.2}$ is selected from unsubstituted or substituted $C_6$-$C_{20}$ aryl or unsubstituted and substituted $C_5$-$C_{20}$ heteroaryl;

$Ar^6$ is selected from unsubstituted or substituted $C_6$-$C_{20}$ arylene, preferably phenylene, biphenylene, terphenylene, fluorenylene;

$Ar^7$ is independently selected from a group consisting of substituted or unsubstituted aryl, substituted or unsubstituted heteroaryl, the aryl and the heteroaryl having 6 to 40 ring-forming atoms, preferably phenyl, naphthyl, phenantryl, fluorenyl, terphenyl, pyridyl, quinolyl, pyrimidyl, triazinyl, benzo[h]quinolinyl, or benzo[4,5]thieno[3,2-d]pyrimidine;

x is selected from 1 or 2, wherein in case that $Ar^5$ is substituted the one or more substituents may independently be selected from $C_1$-$C_{12}$ alkyl and $C_1$-$C_{12}$ heteroalkyl, preferably $C_1$-$C_5$ alkyl;

and in case that $Ar^7$ is substituted, the one or more substituents may be independently selected from $C_1$-$C_{12}$ alkyl and $C_1$-$C_{12}$ heteroalkyl, preferably $C_1$-$C_5$ alkyl, and from $C_6$-$C_{20}$ aryl.

Suitable triazine compounds are disclosed in US 2011/284832, WO 2014/171541, WO 2015/008866, WO2015/105313, JP 2015-074649 A, and JP 2015-126140 and KR 2015/0088712.

Furthermore, it is preferred that the first organic matrix compound comprises a triazine compound substituted with $C_6$-$C_{40}$ aryl, $C_5$-$C_{40}$ heteroaryl and/or $C_1$-$C_{12}$ alkyl groups, preferably 3-[4-(4,6-di-2-naphthalenyl-1,3,5-triazin-2-yl)phenyl]quinolone, 2-[3-(6'-methyl[2,2'-bipyridin]-5-yl)-5-(9-phenanthrenyl)phenyl]-4 phenyl-1,3,5-triazine, 2-(3-(phenanthren-9-yl)-5-(pyridin-2-yl)phenyl)-4,6-diphenyl-1,3,5-triazine, 2,4-diphenyl-6-(5'''-phenyl[1,1':3',1'':3'',1''':3''', 1''''-quinquephenyl]-3-yl)-1,3,5-triazine, 2-([1,1'-biphenyl]-3-yl)-4-(3'-(4,6-diphenyl-1,3,5-triazin-2-yl)-[1,1'-biphenyl]-3-yl)-6-phenyl-1,3,5-triazine and/or 2-(3'-(4,6-diphenyl-1,3,5-triazin-2-yl)-[1,1'-biphenyl]-3-yl)-4-phenylbenzo[4,5]thieno[3,2-d]pyrimidine.

In a further preferred embodiment, the first organic matrix compound comprises a 2-(benzo[d]oxazol-2-yl)phenoxy metal complex or 2-(benzo[d]thiazol-2-yl)phenoxy metal complex of formula (6)

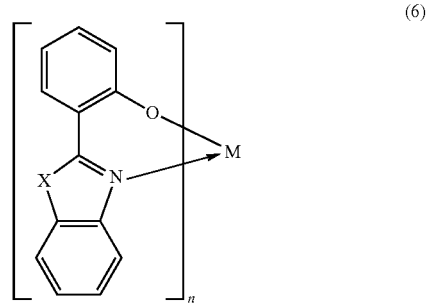

(6)

wherein M is a metal selected from Al, Zr or Sc;

X is selected from O or S; and n is selected from 3 or 4.

Suitable 2-(benzo[d]oxazol-2-yl)phenoxy metal complex or 2-(benzo[d]thiazol-2-yl)phenoxy metal complex are disclosed in WO 2010/020352.

In a preferred embodiment, the first organic matrix compound comprises a benzothienopyrimidine compound substituted with $C_6$-$C_{40}$ aryl, $C_5$-$C_{40}$ heteroaryl and/or $C_1$-$C_{12}$ alkyl groups, preferably 2-phenyl-4-(4',5',6'-triphenyl-[1,1': 2',1'':3'',1'''-quaterphenyl]-3'''-yl)benzo[4,5]thieno[3,2-d]pyrimidine. Suitable benzothienopyrimidine compounds are disclosed in W 2015/0105316.

In a preferred embodiment, the first organic matrix compound comprises a benzo[k]fluoranthene compound substituted with $C_6$-$C_{40}$ aryl, $C_5$-$C_{40}$ heteroaryl and/or $C_1$-$C_{12}$ alkyl groups, preferably 7, 12-diphenylbenzo[k]fluoranthene. Suitable benzo[k]fluoranthene compounds are disclosed in JP10189247 A2.

In a preferred embodiment, the first organic matrix compound comprises a perylene compound substituted with $C_6$-$C_{40}$ aryl, $C_5$-$C_{40}$ heteroaryl and/or $C_1$-$C_{12}$ alkyl groups, preferably 3,9-bis([1,1'-biphenyl]-2-yl)perylene, 3,9-di(naphthalene-2-yl)perylene or 3,10-di(naphthalene-2-yl)perylene. Suitable perylene compounds are disclosed in US2007202354.

In a preferred embodiment, the first organic matrix compound comprises a pyrene compound. Suitable pyrene compounds are disclosed in US20050025993.

In a preferred embodiment, the first organic matrix compound comprises a spiro-fluorene compound. Suitable spiro-fluorene compounds are disclosed in JP2005032686.

In a preferred embodiment, the first organic matrix compound comprises a xanthene compound. Suitable xanthene compounds are disclosed in US2003168970A and WO 2013149958.

In a preferred embodiment, the first organic matrix compound comprises a coronene compound. Suitable coronene compounds are disclosed in Adachi, C.; Tokito, S.; Tsutsui, T.; Saito, S., Japanese Journal of Applied Physics, Part 2: Letters (1988), 27(2), L269-L271.

In a preferred embodiment, the first organic matrix compound comprises a triphenylene compound. Suitable triphenylene compounds are disclosed in US20050025993.

In a preferred embodiment, the first organic matrix compound is selected from carbazole compounds. Suitable carbazole compounds are disclosed in US2015207079.

In a preferred embodiment, the first organic matrix compound is selected from dithienothiophene compounds. Suitable dithienothiophene compounds are disclosed in KR2011085784.

In a preferred embodiment, the first organic matrix compound comprises an anthracene compound. Particularly preferred are anthracene compounds represented by Formula 400 below:

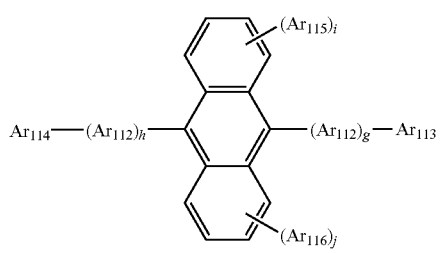

Formula 400

In Formula 400, $Ar_{111}$ and $Ar_{112}$ may be each independently a substituted or unsubstituted $C_6$-$C_{60}$ arylene group; $Ar_{113}$ to $Ar_{116}$ may be each independently a substituted or unsubstituted $C_1$-$C_{10}$ alkyl group or a substituted or unsubstituted $C_6$-$C_{60}$ aryl group; and g, h, i, and j may be each independently an integer from 0 to 4.

In some embodiments, $Ar_{111}$ and $Ar_{112}$ in Formula 400 may be each independently one of a phenylene group, a naphthylene group, a phenanthrenylene group, or a pyrenylene group; or a phenylene group, a naphthylene group, a phenanthrenylene group, a fluorenyl group, or a pyrenylene group, each substituted with at least one of a phenyl group, a naphthyl group, or an anthryl group.

In Formula 400, g, h, i, and j may be each independently an integer of 0, 1, or 2.

In Formula 400, $Ar_{113}$ to $Ar_{116}$ may be each independently one of a $C_1$-$C_{10}$ alkyl group substituted with at least one of a phenyl group, a naphthyl group, or an anthryl group;

a phenyl group, a naphthyl group, an anthryl group, a pyrenyl group, a phenanthrenyl group, or a fluorenyl group;

a phenyl group, a naphthyl group, an anthryl group, a pyrenyl group, a phenanthrenyl group, or a fluorenyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a pyrenyl group, a phenanthrenyl group, or a fluorenyl group; or

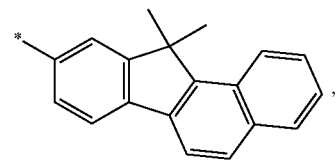 [SMILES: *c1ccc2c(c1)C(C)(C)c1c-2ccc2ccccc12]

but embodiments of the invention are not limited thereto.

According to a further more preferred aspect the first organic matrix compound can be selected from a compound of Table 2 below.

TABLE 2

First organic matrix compounds with a dipole moment ≥0 Debye and ≤2.5 Debye which may be suitable used

| Referred to as: | Structure |
| --- | --- |
| ADN | |
| ETM-1 | |

TABLE 2-continued
First organic matrix compounds with a dipole moment ≥0 Debye and ≤2.5 Debye which may be suitable used
| Referred to as: | Structure |
|---|---|
| ETM-2 | 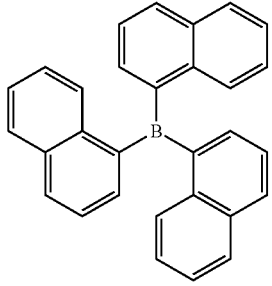 [SMILES: c1ccc2c(B(c3cccc4ccccc34)c3cccc4ccccc34)cccc2c1] |
| ETM-3 | 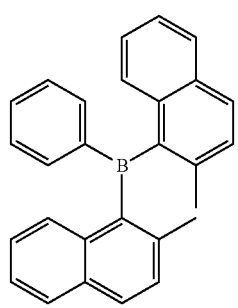 [SMILES: Cc1ccc2ccccc2c1B(c1ccccc1)c1c(C)ccc2ccccc12] |
| ETM-4 | 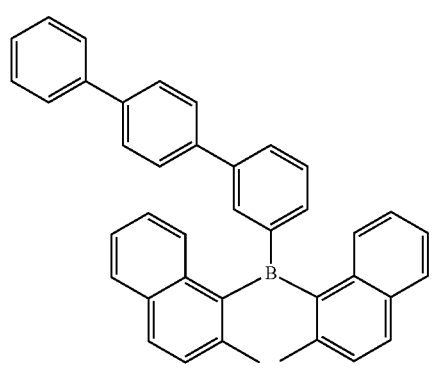 [SMILES: Cc1ccc2ccccc2c1B(c1cccc(-c2ccc(-c3ccccc3)cc2)c1)c1c(C)ccc2ccccc12] |
| ETM-5 | 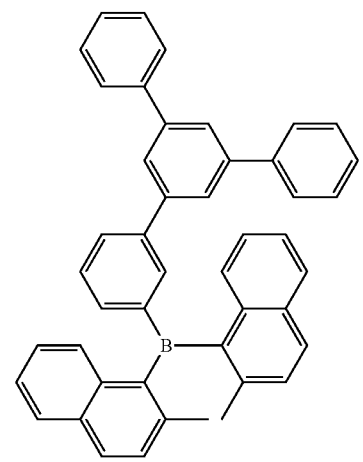 [SMILES: Cc1ccc2ccccc2c1B(c1cccc(-c2cc(-c3ccccc3)cc(-c3ccccc3)c2)c1)c1c(C)ccc2ccccc12] |

TABLE 2-continued
First organic matrix compounds with a dipole moment ≥0 Debye and ≤2.5 Debye which may be suitable used
| Referred to as: | Structure |
| --- | --- |
| ETM-6 | 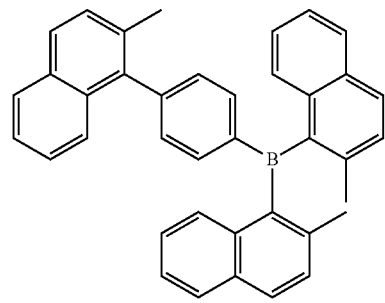 [SMILES: Cc1ccc2ccccc2c1B(c1ccc(-c2c(C)ccc3ccccc23)cc1)c1c(C)ccc2ccccc12] |
| ETM-7 | 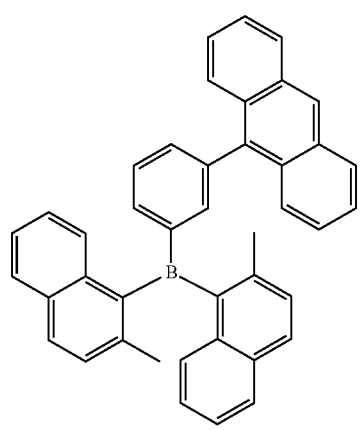 [SMILES: Cc1ccc2ccccc2c1B(c1cccc(-c2c3ccccc3cc3ccccc23)c1)c1c(C)ccc2ccccc12] |
| ETM-8 | 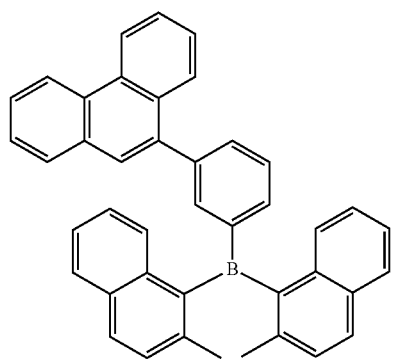 [SMILES: Cc1ccc2ccccc2c1B(c1cccc(-c2cc3ccccc3c3ccccc23)c1)c1c(C)ccc2ccccc12] |
| ETM-9 | 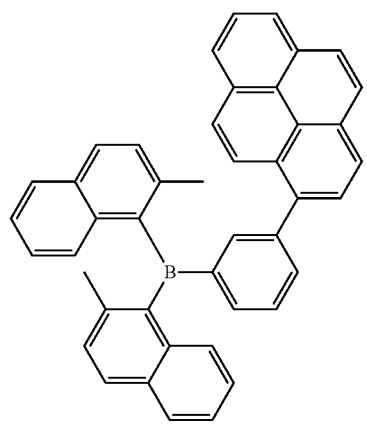 [SMILES: Cc1ccc2ccccc2c1B(c1cccc(-c2ccc3ccc4cccc5ccc2c3c45)c1)c1c(C)ccc2ccccc12] |

TABLE 2-continued
First organic matrix compounds with a dipole moment ≥0 Debye and ≤2.5 Debye which may be suitable used
| Referred to as: | Structure |
| --- | --- |
| ETM-10 | 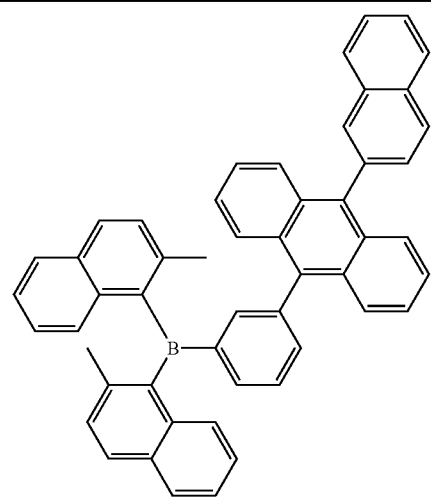 |
| ETM-11 | 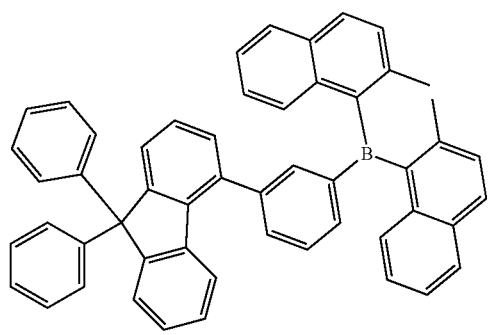 [SMILES: Cc1ccc2ccccc2c1B(c1cccc(-c2cccc3c2-c2ccccc2C3(c2ccccc2)c2ccccc2)c1)c1c(C)ccc2ccccc12] |
| ETM-12 | 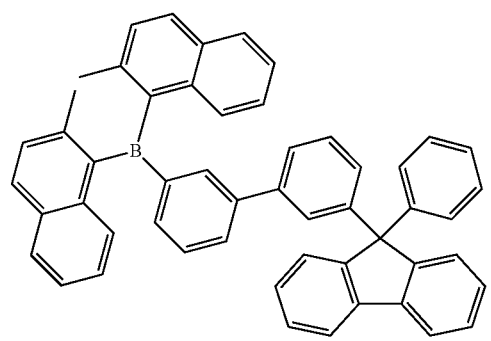 [SMILES: Cc1ccc2ccccc2c1B(c1cccc(-c2cccc(C3(c4ccccc4)c4ccccc4-c4ccccc43)c2)c1)c1c(C)ccc2ccccc12] |
| ETM-13 | 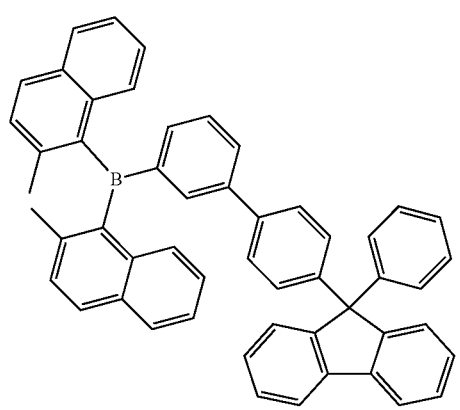 [SMILES: Cc1ccc2ccccc2c1B(c1cccc(-c2ccc(C3(c4ccccc4)c4ccccc4-c4ccccc43)cc2)c1)c1c(C)ccc2ccccc12] |

TABLE 2-continued
First organic matrix compounds with a dipole moment ≥0 Debye and ≤2.5 Debye which may be suitable used
| Referred to as: | Structure |
|---|---|
| ETM-14 | 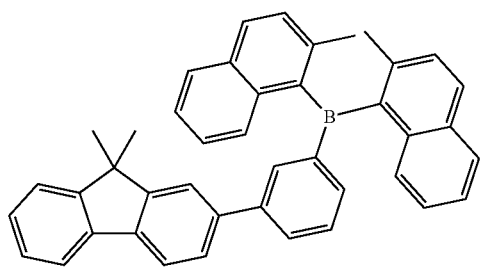 [SMILES: Cc1ccc2ccccc2c1B(c1cccc(-c2ccc3c(c2)C(C)(C)c2ccccc2-3)c1)c1c(C)ccc2ccccc12] |
| ETM-15 | 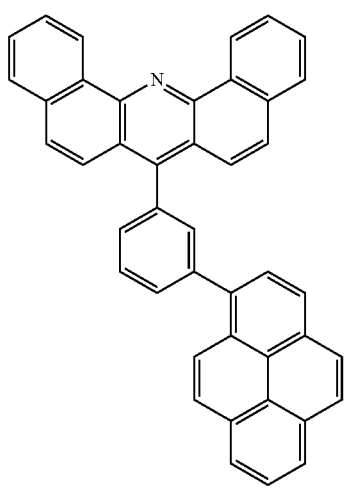 [SMILES: c1cc(-c2c3ccc4ccccc4c3nc3c2ccc2ccccc23)cc(-c2ccc3ccc4cccc5ccc2c3c45)c1] |
| ETM-16 | 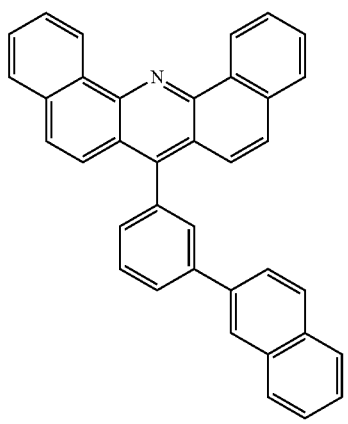 [SMILES: c1cc(-c2ccc3ccccc3c2)cc(-c2c3ccc4ccccc4c3nc3c2ccc2ccccc23)c1] |
| ETM-17 | 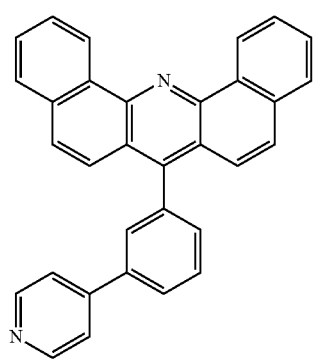 [SMILES: c1cc(-c2ccncc2)cc(-c2c3ccc4ccccc4c3nc3c2ccc2ccccc23)c1] |

TABLE 2-continued
First organic matrix compounds with a dipole moment ≥0 Debye and ≤2.5 Debye which may be suitable used
| Referred to as: | Structure |
|---|---|
| ETM-18 | 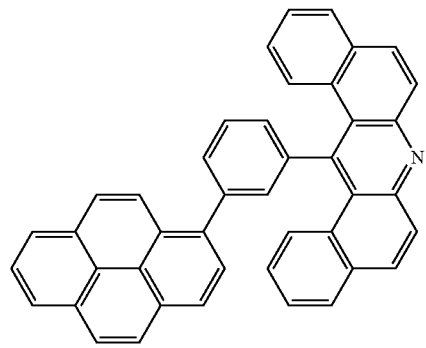 [SMILES: c1cc(-c2ccc3ccc4cccc5ccc2c3c45)cc(-c2c3c(ccc4ccccc43)nc3ccc4ccccc4c23)c1] |
| ETM-19 | 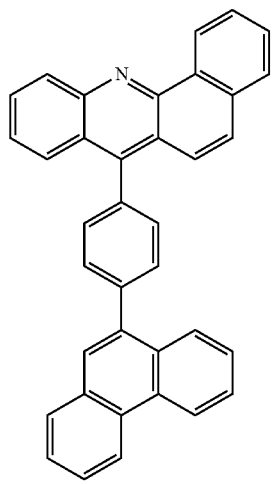 [SMILES: c1ccc2c(c1)cc(-c1ccc(-c3c4ccccc4nc4c3ccc3ccccc34)cc1)c1ccccc12] |
| ETM-20 | 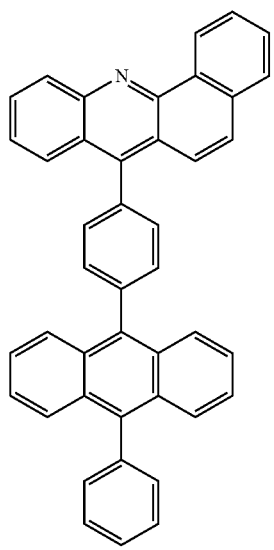 [SMILES: c1ccc(-c2c3ccccc3c(-c3ccc(-c4c5ccccc5nc5c4ccc4ccccc45)cc3)c3ccccc23)cc1] |

TABLE 2-continued
First organic matrix compounds with a dipole moment ≥0 Debye and ≤2.5 Debye which may be suitable used
| Referred to as: | Structure |
|---|---|
| ETM-21 | 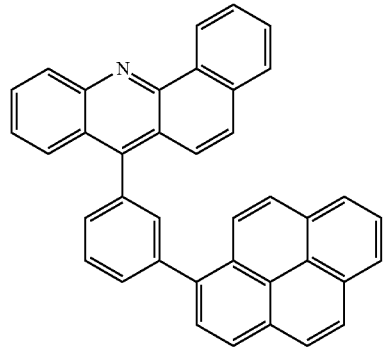 [SMILES: c1cc(-c2c3ccccc3nc3c2ccc2ccccc23)cc(-c2ccc3ccc4cccc5ccc2c3c45)c1] |
| ETM-22 | 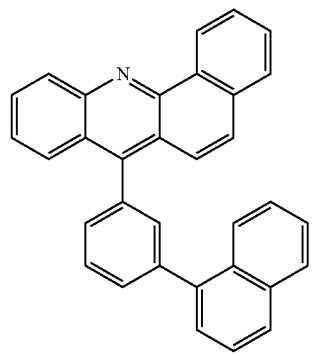 [SMILES: c1cc(-c2cccc3ccccc23)cc(-c2c3ccccc3nc3c2ccc2ccccc23)c1] |
| ETM-23 | 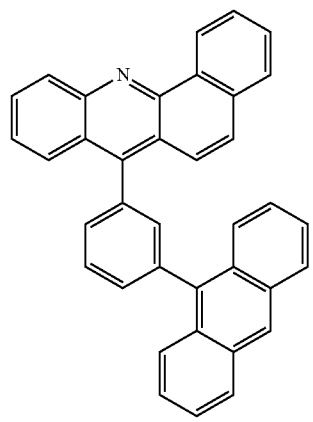 [SMILES: c1cc(-c2c3ccccc3cc3ccccc23)cc(-c2c3ccccc3nc3c2ccc2ccccc23)c1] |
| ETM-24 | 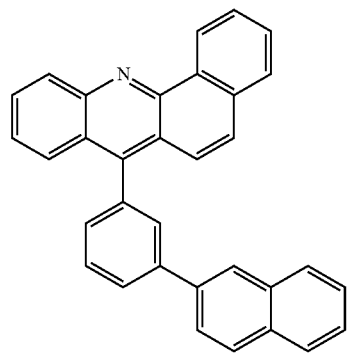 [SMILES: c1cc(-c2ccc3ccccc3c2)cc(-c2c3ccccc3nc3c2ccc2ccccc23)c1] |

TABLE 2-continued
First organic matrix compounds with a dipole moment ≥0 Debye and ≤2.5 Debye which may be suitable used
| Referred to as: | Structure |
|---|---|
| ETM-25 | 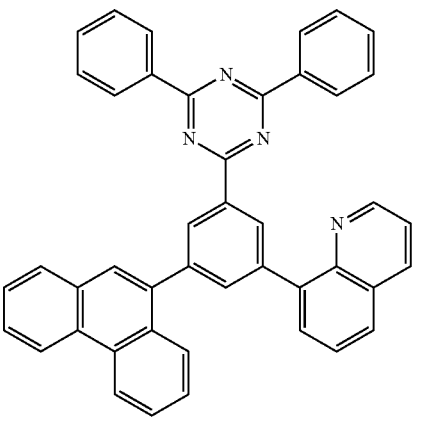 [SMILES: c1ccc(-c2nc(-c3ccccc3)nc(-c3cc(-c4cc5ccccc5c5ccccc45)cc(-c4cccc5cccnc45)c3)n2)cc1] |
| ETM-26 | 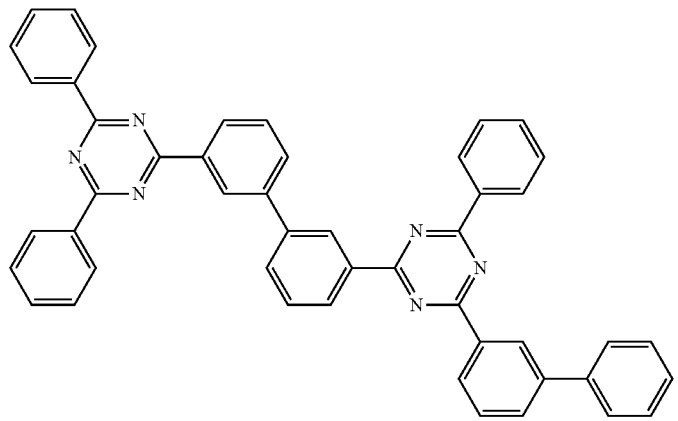 [SMILES: c1ccc(-c2cccc(-c3nc(-c4ccccc4)nc(-c4cccc(-c5cccc(-c6nc(-c7ccccc7)nc(-c7ccccc7)n6)c5)c4)n3)c2)cc1] |
| ETM-27 | 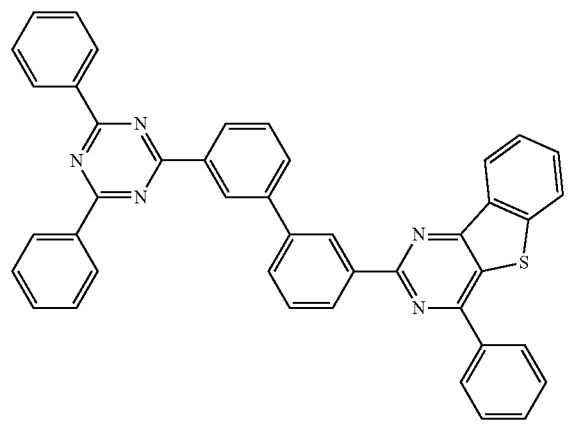 [SMILES: c1ccc(-c2nc(-c3ccccc3)nc(-c3cccc(-c4cccc(-c5nc(-c6ccccc6)c6sc7ccccc7c6n5)c4)c3)n2)cc1] |
| ETM-28 | 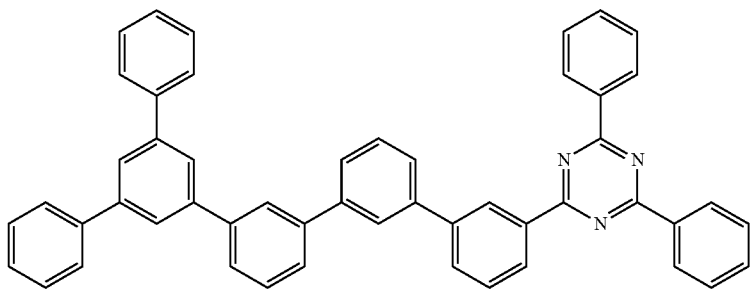 [SMILES: c1ccc(-c2cc(-c3ccccc3)cc(-c3cccc(-c4cccc(-c5cccc(-c6nc(-c7ccccc7)nc(-c7ccccc7)n6)c5)c4)c3)c2)cc1] |

TABLE 2-continued
First organic matrix compounds with a dipole moment ≥0 Debye and ≤2.5 Debye which may be suitable used
| Referred to as: | Structure |
|---|---|
| ETM-29 | 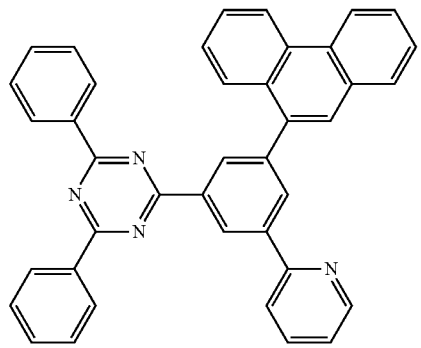 [SMILES: c1ccc(-c2nc(-c3ccccc3)nc(-c3cc(-c4ccccn4)cc(-c4cc5ccccc5c5ccccc45)c3)n2)cc1] |
| ETM-30 | 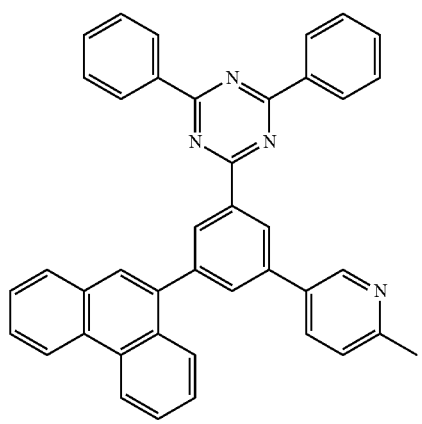 [SMILES: Cc1ccc(-c2cc(-c3nc(-c4ccccc4)nc(-c4ccccc4)n3)cc(-c3cc4ccccc4c4ccccc34)c2)cn1] |
| ETM-31 | 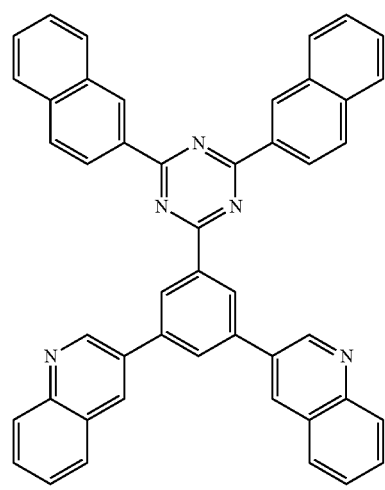 [SMILES: c1ccc2cc(-c3nc(-c4cc(-c5cnc6ccccc6c5)cc(-c5cnc6ccccc6c5)c4)nc(-c4ccc5ccccc5c4)n3)ccc2c1] |

TABLE 2-continued
First organic matrix compounds with a dipole moment ≥0 Debye and ≤2.5 Debye which may be suitable used
| Referred to as: | Structure |
|---|---|
| ETM-32 | 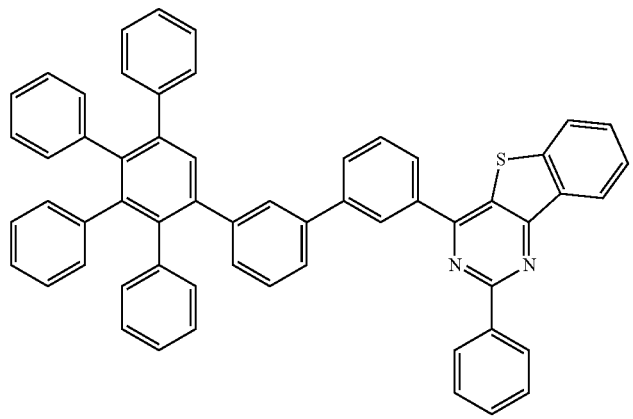 [SMILES: c1ccc(-c2nc(-c3cccc(-c4cccc(-c5cc(-c6ccccc6)c(-c6ccccc6)c(-c6ccccc6)c5-c5ccccc5)c4)c3)c3sc4ccccc4c3n2)cc1] |
| ETM-33 | 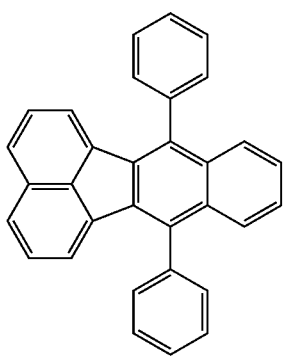 [SMILES: c1ccc(-c2c3c(c(-c4ccccc4)c4ccccc24)-c2cccc4cccc-3c24)cc1] |
| ETM-34 | 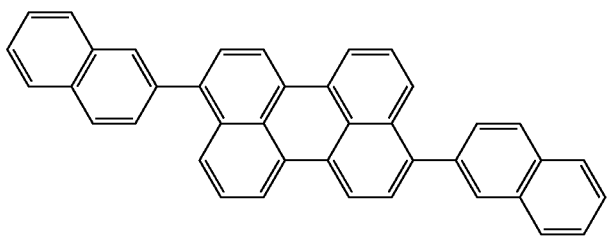 [SMILES: c1ccc2cc(-c3ccc4c5cccc6c(-c7ccc8ccccc8c7)ccc(c7cccc3c74)c65)ccc2c1] |
| ETM-35 | 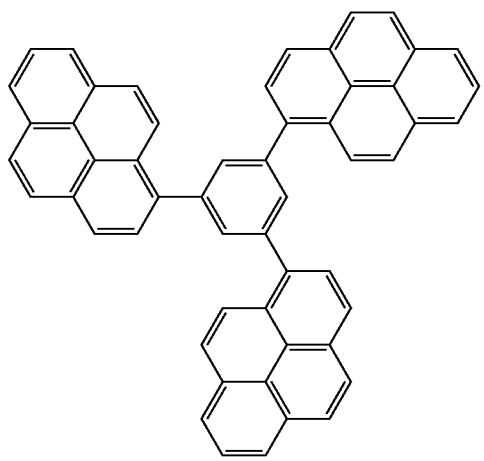 [SMILES: c1cc2ccc3ccc(-c4cc(-c5ccc6ccc7cccc8ccc5c6c78)cc(-c5ccc6ccc7cccc8ccc5c6c78)c4)c4ccc(c1)c2c34] |

TABLE 2-continued

First organic matrix compounds with a dipole moment ≥0 Debye and ≤2.5 Debye which may be suitable used

| Referred to as: | Structure |
|---|---|
| ETM-36 | 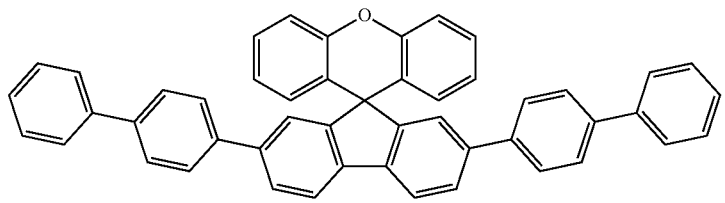 [SMILES: c1ccc(-c2ccc(-c3ccc4c(c3)C3(c5ccccc5Oc5ccccc53)c3cc(-c5ccc(-c6ccccc6)cc5)ccc3-4)cc2)cc1] |
| ETM-37 | 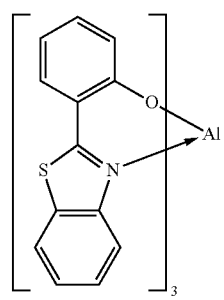 |
| ETM-38 | 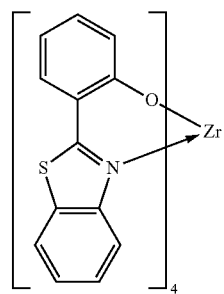 |

Table 3 below shows the dipole moments of representative examples of the first organic matrix compound with a dipole moment ≥0 Debye and ≤2.5 Debye.

TABLE 3

Representative examples of the first organic matrix compound with a dipole moment ≥0 Debye and ≤2.5 Debye

| Referred to as: | Name | Structure | Dipole moment/ Debye |
|---|---|---|---|
| ADN | 9,10-di(naphthalen-2-yl)anthracene | | 0.01 |

TABLE 3-continued
Representative examples of the first organic matrix compound with a dipole moment ≥0 Debye and ≤2.5 Debye
| Referred to as: | Name | Structure | Dipole moment/ Debye |
|---|---|---|---|
| ETM-2 | Tri(naphthalen-1-yl)borane | 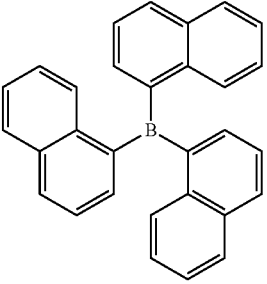 [SMILES: c1ccc2c(B(c3cccc4ccccc34)c3cccc4ccccc34)cccc2c1] | 0.14 |
| ETM-8 | bis(2-methylnaphthalen-1-yl)(3-(phenanthren-9-yl)phenyl)borane | 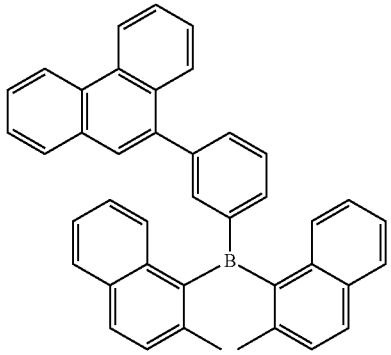 [SMILES: Cc1ccc2ccccc2c1B(c1cccc(-c2cc3ccccc3c3ccccc23)c1)c1c(C)ccc2ccccc12] | 0.18 |
| ETM-15 | 7-(3-(pyren-1-yl)phenyl)dibenzo[c,h]acridine | 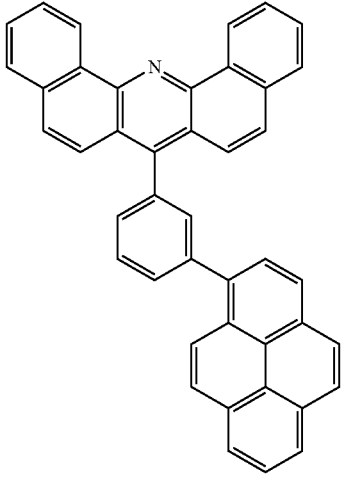 [SMILES: c1cc(-c2c3ccc4ccccc4c3nc3c2ccc2ccccc23)cc(-c2ccc3ccc4cccc5ccc2c3c45)c1] | 1.80 |
| ETM-17 | 7-(3-(pyridin-4-yl)phenyl)dibenzo[c,h]acridine | 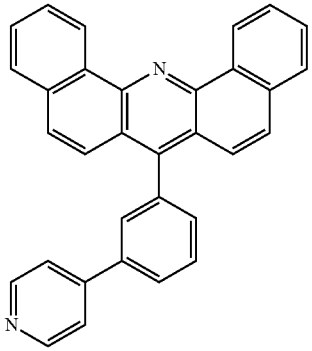 [SMILES: c1cc(-c2ccncc2)cc(-c2c3ccc4ccccc4c3nc3c2ccc2ccccc23)c1] | 2.26 |

TABLE 3-continued

Representative examples of the first organic matrix compound with a dipole moment ≥0 Debye and ≤2.5 Debye

| Referred to as: | Name | Structure | Dipole moment/ Debye |
|---|---|---|---|
| ETM-18 | 14-(3-(pyren-1-yl)phenyl)dibenzo[a,j]acridine | | 2.50 |
| ETM-21 | 7-(3-(pyren-1-yl)phenyl)benzo[c]acridine | | 2.13 |
| ETM-29 | 2-(3-(phenanthren-9-yl)-5-(pyridin-2-yl)phenyl)-4,6-diphenyl-1,3,5-triazine | | 1.76 |
| ETM-28 | 2,4-diphenyl-6-(5'''-phenyl-[1,1':3',1'':3'',1''':3''',1''''-quinquephenyl]-3-yl)-1,3,5-triazine | | 0.23 |

TABLE 3-continued

Representative examples of the first organic matrix compound with a dipole moment ≥0 Debye and ≤2.5 Debye

| Referred to as: | Name | Structure | Dipole moment/ Debye |
|---|---|---|---|
| ETM-26 | 2-([1,1'-biphenyl]-3-yl)-4-(3'-(4,6-diphenyl-1,3,5-triazin-2-yl)-[1,1'-biphenyl]-3-yl)-6-phenyl-1,3,5-triazine | | 0.13 |
| ETM-27 | 2-(3'-(4,6-diphenyl-1,3,5-triazin-2-yl)-[1,1'-biphenyl]-3-yl)-4-phenyl-benzo[4,5]thieno[3,2-d]pyrimidine | | 2.0 |
| ETM-32 | 2-phenyl-4-(4',5',6'-triphenyl-[1,1':2',1'':3'',1'''-quaterphenyl]-3'''-yl)benzo[4,5]thieno[3,2-d]pyrimidine | | 1.6 |

TABLE 3-continued

Representative examples of the first organic matrix compound with a dipole moment ≥0 Debye and ≤2.5 Debye

| Referred to as: | Name | Structure | Dipole moment/ Debye |
|---|---|---|---|
| ETM-33 | 7,12-diphenyl-benzo[k]fluoranthene (CAS 16391-62-1) | | 0.13 |
| ETM-34 | 3,9-di(naphthalen-2-yl)perylene (CAS 959611-30-4) | | 0.12 |

According to various embodiments of the OLED of the present invention the thicknesses of the electron transport layer may be in the range of about ≥0.5 nm to about ≤95 nm, preferably of about ≥3 nm to about ≤80 nm, further preferred of about ≥5 nm to about ≤60 nm, also preferred of about ≥6 nm to about ≤40 nm, in addition preferred about ≥8 nm to about ≤20 nm and more preferred of about ≥3 nm to about ≤18 nm.

Charge Generation Layer

Charge generation layers (CGL) that can be suitable used for the OLED of the present invention are described in US 2012098012 A.

The charge generation layer is generally composed of a double layer. The charge generation layer can be a pn junction charge generation layer joining n-type charge generation layer and p-type charge generation layer. The pn junction charge generation layer generates charges or separates them into holes and electrons; and injects the charges into the individual light emission layer. In other words, the n-type charge generation layer provides electrons for the first light emission layer adjacent to the anode electrode while the p-type charge generation layer provides holes to the second light emission layer adjacent to the cathode electrode, by which luminous efficiency of an organic light emitting device incorporating multiple light emission layers can be further improved and at the same time, driving voltage can be lowered.

The p-type charge generation layer can be composed of metal or organic material doped with p-type dopant. Here, the metal can be one or an alloy consisting of two or more selected from a group consisting of Al, Cu, Fe, Pb, Zn, Au, Pt, W, In, Mo, Ni, and Ti. Also, p-type dopant and host used for organic material doped with the p-type can employ conventional materials. For example, the p-type dopant can be one selected from a group consisting of tetrafluore-7,7,8,8-tetracyanoquinodimethane (F4-TCNQ), derivative of tetracyanoquinodimethane, radialene derivative, iodine, FeCl3, FeF3, and SbCl5. Also, the host can be one selected from a group consisting of N,N'-di(naphthalen-1-yl)-N,N-diphenyl-benzidine (NPB), N,N'-diphenyl-N,N'-bis(3-methylphenyl)-1,1-biphenyl-4,4'-diamine (TPD) and N,N',N'-tetranaphthylbenzidine (TNB).

The n-type charge generation layer can be composed of metal or organic material doped with n-type. The metal can be one selected from a group consisting of Li, Na, K, Rb, Cs, Mg, Ca, Sr, Ba, La, Ce, Sm, Eu, Tb, Dy, and Yb. Also, n-type dopant and host used for organic material doped with the n-type can employ conventional materials. For example, the n-type dopant can be alkali metal, alkali metal compound, alkali earth metal, or alkali earth metal compound. More specifically, the n-type dopant can be one selected from a group consisting of Cs, K, Rb, Mg, Na, Ca, Sr, Eu and Yb. The host material can be one selected from a group consisting of tris(8-hydroxyquinoline)aluminum, triazine, hydroxyquinoline derivative, benzazole derivative, and silole derivative.

In another preferred embodiment, the n-type charge generation layer is arranged adjacent to the electron transport layer. The n-type charge generation layer according to one embodiment may include compounds of the following Chemical Formula 16.

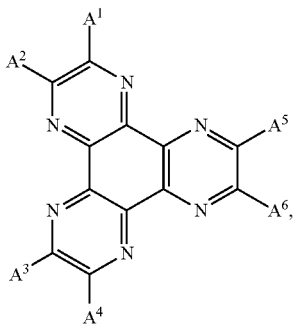

(16)

wherein
each of $A^1$ to $A^6$ may be hydrogen, a halogen atom, nitrile (—CN), nitro (—NO$_2$), sulfonyl (—SO$_2$R), sulfoxide (—SOR), sulfonamide (—SO$_2$NR), sulfonate (—SO$_3$R), trifluoromethyl (—CF$_3$), ester (—COOR), amide (—CONHR or —CONRR'), substituted or unsubstituted straight-chain or branched-chain $C_1$-$C_{12}$ alkoxy, substituted or unsubstituted straight-chain or branched-chain $C_1$-$C_{12}$ alkyl, substituted or unsubstituted straight-chain or branched chain $C_2$-$C_{12}$ alkenyl, a substituted or unsubstituted aromatic or non-aromatic heteroring, substituted or unsubstituted aryl, substituted or unsubstituted mono- or di-arylamine, substituted or unsubstituted aralkylamine, or the like.

Herein, each of the above R and R' may be substituted or unsubstituted $C_1$-$C_{60}$ alkyl, substituted or unsubstituted aryl, or a substituted or unsubstituted 5- to 7-membered heteroring, or the like.

Particularly preferred is an n-type charge generation layer comprising a compound of Formula (17)

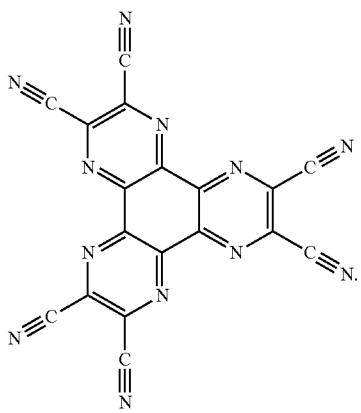

(17)

The p-type charge generation layer is arranged on top of the n-type charge generation layer. As the materials for the p-type charge generation layer, aryl amine-based compounds may be used. One embodiment of the aryl amine-based compounds includes compounds of the following Chemical Formula 18:

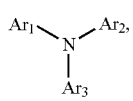

(18)

wherein
Ar$_1$, Ar$_2$ and Ar$_3$ are each independently hydrogen or a hydrocarbon group. Herein, at least one of Ar$_1$, Ar$_2$ and Ar$_3$ may include aromatic hydrocarbon substituents, and each substituent may be the same, or they may be composed of different substituents. When Ar$_1$, Ar$_2$ and Ar$_3$ are not aromatic hydrocarbons, they may be hydrogen; a straight-chain, branched-chain or cyclic aliphatic hydrocarbon; or a heterocyclic group including N, O, S or Se.

In another aspect of the present invention, the organic light emitting diode (100) further comprises an n-type CGL (185), a p-type CGL (135) and the organic semiconductor layer in direct contact with the n-type CGL. In a preferred embodiment, the n-type CGL comprises or consists of the first zero-valent metal.

The object is further achieved by a method for preparing an organic light emitting diode according to any of the preceding claims, the method comprising a step of:
Co-depositing at least one alkali organic complex and at least one compound of formula 1 as defined in claim 1

Formula 1

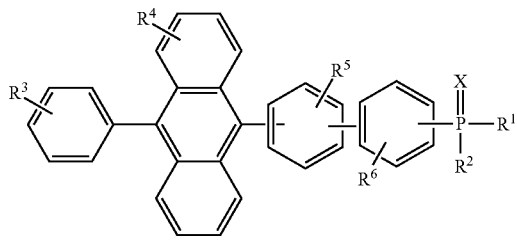

The term co-deposition in this regard is particularly related to depositing the alkali organic complex from a first evaporation source and the compound of Formula 1 from a second evaporation source.

In this regard, it is preferred that the method comprises the steps of:
Depositing an anode electrode on a substrate;
Depositing an emission layer on the anode;
Depositing the organic semiconductor layer on the emission layer; and
Depositing the cathode electrode on the organic semiconductor layer.

In this regard, it may be preferred that the method comprises a further step of depositing an electron transport layer on the emission layer. In this case, it is clear that the organic semiconductor layer is deposited on the electron transport layer instead.

In another preferred embodiment, the method comprises the steps of:
Depositing a cathode electrode on a substrate;
Depositing the organic semiconductor layer on the cathode;
Depositing an emission layer on the organic semiconductor layer, and
Depositing the anode electrode on the emission layer.

Depositing in terms of the invention may be achieved by depositing via vacuum thermal evaporation or depositing via solution processing, preferably, the processing being selected from spin-coating, printing, casting and/or slot-dicoating.

It is preferred that depositing the organic semiconductor layer comprises vacuum thermal evaporation.

The object is finally achieved by a compound of Formula 1

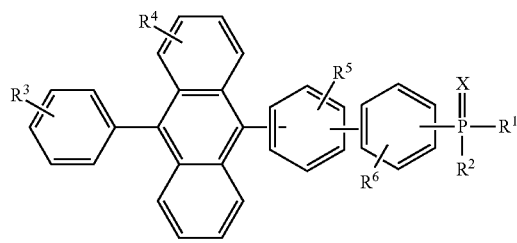

Formula 1 wherein
X is selected from O, S or Se;
$R^1$ and $R^2$ are independently selected from the group consisting of $C_6$ to $C_{18}$ aryl group and $C_5$ to $C_{18}$ heteroaryl group, wherein each of $R^1$ and $R^2$ may independently be unsubstituted or substituted with at least one $C_1$ to $C_2$ alkyl group or $C_1$ to $C_2$ alkoxy group, preferably $C_1$ to $C_4$ alkyl group or $C_1$ to $C_4$ alkoxy group; and
each $R^3$, $R^4$, $R^5$, and $R^6$ are independently selected from the group consisting of H, $C_1$ to $C_{12}$ alkyl group or $C_1$ to $C_{12}$ alkoxy group, preferably H, $C_1$ to $C_4$ alkyl group or $C_1$ to $C_4$ alkoxy group.

Definitions and explanations provided with respect to the compounds of formula 1 in the organic semiconductive layer are also true with respect to the inventive compound and throughout the whole application text.

To simplify the synthesis of the inventive compounds, it may be preferred that $R^1$ and $R^2$ are selected the same. That is, it is preferred that $R^1$ and $R^2$ are the same group.

It is further preferred that $R^1$ and $R^2$ are independently selected from $C_6$ to $C_{18}$ aryl group, preferably $C_6$ to $C_{12}$ aryl group, more preferred phenyl group. By appropriately selecting the number of carbon atoms in the groups $R^1$ and $R^2$ the chemical and physical properties, such as solubility, of the inventive compound may be easily adjusted.

It may further be preferred that X is selected as O.

It is further preferred that the biphenylene group is attached to the adjacent phosphorous containing group and/or the adjacent anthrancenylene group in meta-position.

As demonstrated below by referring to inventive examples and comparative examples representing the prior art, it was surprisingly found by the inventors that the inventive compounds indeed solves the problem of the prior art outlined above by featuring increased efficiency and improved operating voltage as well as improved glass transition temperature and stability.

In detail, comparison of the inventive compounds with the prior art results in the following observations.

Phosphine compound A which is typically used in OLEDs of the prior art has several drawbacks.

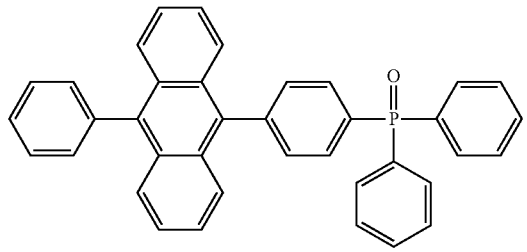 [SMILES: O=P(c1ccccc1)(c1ccccc1)c1ccc(-c2c3ccccc3c(-c3ccccc3)c3ccccc23)cc1]

Compound A

The glass transition temperature is low at 112 Celsius. Additionally, the operating voltage of OLEDs is high and the efficiency is low, thereby limiting battery life of mobile devices, see Experimental part.

Attempts at increasing the glass transition temperature have resulted in compounds with a more bulky substituent in 10-position on the anthracene group, for example naphthyl substituents in compound B and compound C

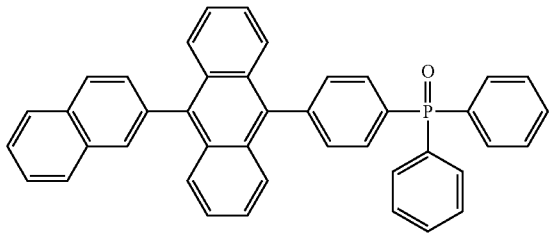 [SMILES: O=P(c1ccccc1)(c1ccccc1)c1ccc(-c2c3ccccc3c(-c3ccc4ccccc4c3)c3ccccc23)cc1]

Compound B

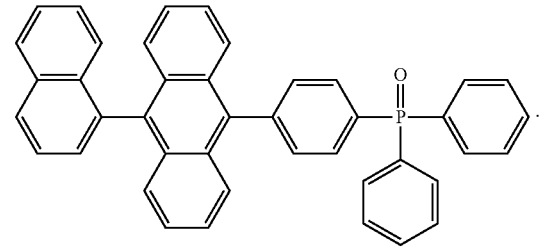

Compound C

The glass transition temperature is increased to 134 and 139 Celsius, respectively. However, the operating voltage is not improved and the lifetime is much shorter compared to a device comprising compound A, see Experimental Part. Additionally, the volatility of compound B is too low, therefore it is not suitable for manufacturing of OLEDs using vacuum thermal evaporation (VTE). Low volatility may result in partial decomposition of the compound in the VTE source during manufacturing of the OLED when using evaporation and subsequent deposition as a means of transferring the compound from the source to the substrate.

In compound D, the glass transition temperature is increased through a biphenyl substituent in 10-position of the anthracene group Compound D

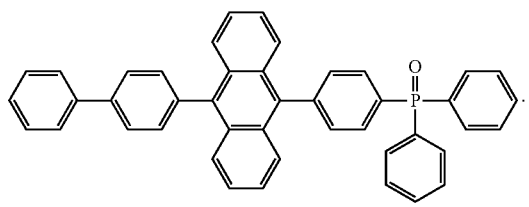

The glass transition temperature remains high at 130 Celsius and but the operating voltage is still high and the efficiency is low, see Experimental Part.

It has surprisingly been found that a biphenylene linker attached to the adjacent phosphorus containing group and/or the adjacent anthracenylene group and leads to a significant improvement in operating voltage and efficiency while retaining high glass transition temperature. To ensure that the volatility remains in a range suitable for manufacturing, it has been found that a phenyl substituent in 10-position on the anthracenylene group is required. Larger substituents result in too low volatility and a hydrogen atom in 10-position on the anthracenylene group leads to very low glass transition temperature. For example, Compound G Compound G

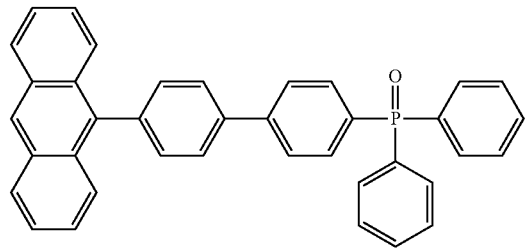

has a Tg of 109° C.

A particularly beneficial effect on performance is observed for a biphenylene group which is attached to the adjacent phosphorus group and/or the adjacent anthracenylene group in meta-position.

The beneficial effect on device performance is observed for a range of different alkali organic complexes. Particularly preferred are LiQ and Li-1, see Table 1.

Light-Emitting Diode (OLED)

According to another aspect of the present invention, there is provided an organic light-emitting diode (OLED) comprising: a substrate, an anode electrode, a hole injection layer, a hole transport layer, optional an electron blocking layer, an emission layer, optional a hole blocking layer, optional an electron transport layer, the inventive organic semiconductor layer, optional an electron injection layer and a cathode electrode layer, wherein the layers are arranged in that order.

According to another aspect of the present invention, there is provided an organic light-emitting diode (OLED) comprising: a substrate, an anode electrode a first hole injection layer, a first hole transport layer, optional first electron blocking layer, a first emission layer, optional a first hole blocking layer, optional a first electron transport layer, optional an organic semiconductor layer of the present invention, an n-type charge generation layer, a p-type charge generation layer, a second hole transport layer, optional second electron blocking layer a second emission layer, optional a second hole blocking layer, optional a second electron transport layer, the organic semiconductor layer, optional an electron injection layer and a cathode electrode layer, wherein the layers are arranged in that order.

According to various embodiments of the OLED of the present invention, the OLED may not comprises an electron transport layer.

According to various embodiments of the OLED of the present invention, the OLED may not comprises an electron blocking layer.

According to various embodiments of the OLED of the present invention, the OLED may not comprises a hole blocking layer.

According to various embodiments of the OLED of the present invention, the OLED may not comprises a charge generation layer.

According to various embodiments of the OLED of the present invention, the OLED may not comprises a second emission layer.

Method of Manufacture

According to various embodiments of the present invention, the method may further include forming on a substrate an anode electrode a hole injection layer, a hole transport layer, optional an electron blocking layer, an emission layer, optional a hole blocking layer, optional an electron transport layer, the organic semiconductor layer, optional an electron injection layer, and a cathode electrode layer, wherein the layers are arranged in that order; or the layers can be deposited the other way around, starting with the cathode electrode layer, and more preferred the organic semiconductor layer is be deposited before the cathode electrode layer is deposited.

Particularly low operating voltage and/or high external quantum efficiency EQE may be achieved when the organic semiconductor layer is deposited before the first cathode electrode layer.

According to various embodiments of the present invention, the method may further include forming on a substrate an anode electrode a first hole injection layer, a first hole transport layer, optional first electron blocking layer, a first emission layer, optional a first hole blocking layer, optional a first electron transport layer, optional the organic semiconductor layer of the present invention, an n-type charge generation layer, an p-type charge generation layer, a second hole transport layer, optional second electron blocking layer, a second emission layer, optional a second hole blocking layer, optional a second electron transport layer, the organic semiconductor layer, optional an electron injection layer and a cathode electrode layer, wherein the layers are arranged in that order, or the layers are deposited the other way around, starting with the cathode electrode layer; and more preferred the organic semiconductor layer is be deposited before the cathode electrode layer is deposited.

However, according to one aspect the layers are deposited the other way around, starting with the cathode electrode, and sandwiched between the cathode electrode and the anode electrode.

For example, starting with the first cathode electrode layer, optional electron injection layer, the organic semiconductor layer, optional electron transport layer, optional hole blocking layer, emission layer, optional electron blocking layer, hole transport layer, hole injection layer, anode electrode, exactly in this order.

The anode electrode and/or the cathode electrode can be deposited on a substrate. Preferably the anode is deposited on a substrate.

According to another aspect of the present invention, there is provided a method of manufacturing an organic light-emitting diode (OLED), the method using:
- at least one deposition source, preferably two deposition sources and more preferred at least three deposition sources; and/or
- deposition via vacuum thermal evaporation (VTE); and/or
- deposition via solution processing, preferably the processing is selected from spin-coating, printing, casting and/or slot-die coating.

Electronic Device

Another aspect is directed to an electronic device comprising at least one organic light-emitting diode (OLED). A device comprising organic light emitting diodes (OLED) is for example a display or a lighting panel.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the present invention will become apparent and more readily appreciated from the following description of the exemplary embodiments, taken in conjunction with the accompanying drawings, of which.

DETAILED DESCRIPTION

Figure 1:
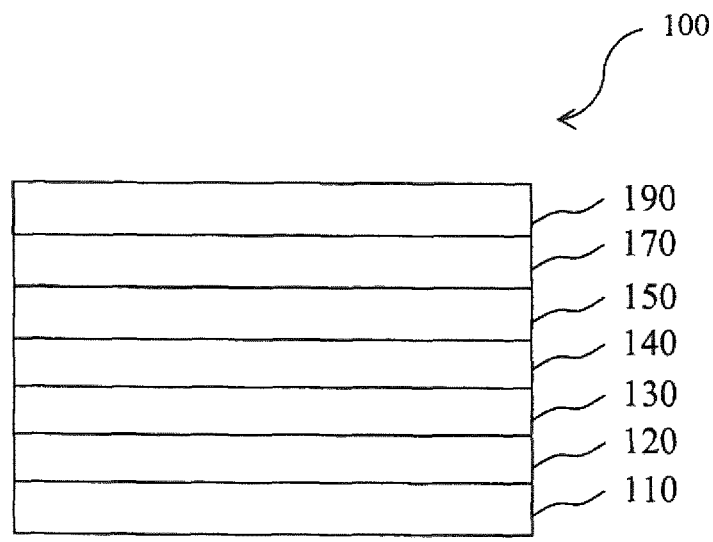
FIG. 1 is a schematic sectional view of an organic light-emitting diode (OLED), according to an exemplary embodiment of the present invention.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures.

Herein, when a first element is referred to as being formed or disposed "on" a second element, the first element can be disposed directly on the second element, or one or more other elements may be disposed there between. When a first element is referred to as being formed or disposed "directly on" a second element, no other elements are disposed there between.

FIG. 1 is a schematic sectional view of an organic light-emitting diode (OLED) 100, according to an exemplary embodiment of the present invention. The OLED 100 includes a substrate 110, an anode electrode 120, a hole injection layer (HIL) 130, a hole transport layer (HTL) 140, an emission layer (EML) 150. Onto the emission layer (EML) 150 the organic semiconductor layer 170 is disposed. The organic semiconductor layer 170 comprising or consisting of an alkali organic complex and a compound of formula 1 is formed directly on the EML 150. The cathode electrode layer 190 is disposed directly onto the organic semiconductor layer 170.

Figure 2:
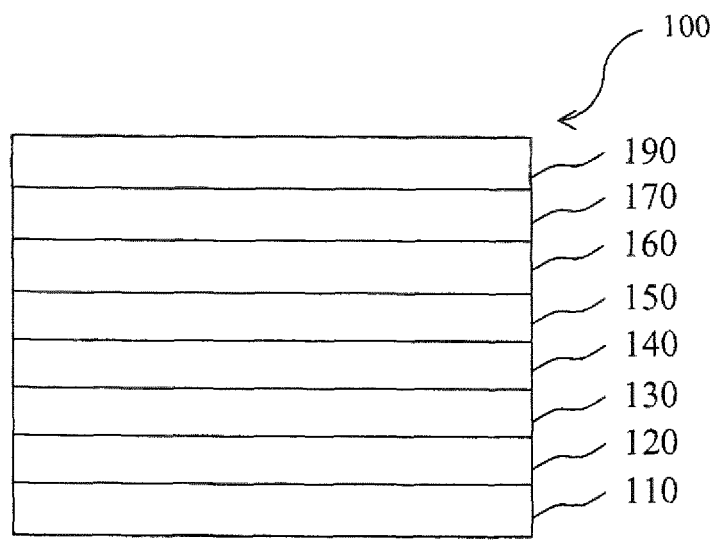
FIG. 2 is a schematic sectional view of an OLED, according to another exemplary embodiment of the present invention.

FIG. 2 is a schematic sectional view of an OLED 100, according to another exemplary embodiment of the present invention. FIG. 2 differs from FIG. 1 in that the OLED 100 of FIG. 2 comprises an electron transport layer 160.

Referring to FIG. 2 the OLED 100 includes a substrate 110, an anode electrode 120, a hole injection layer (HIL) 130, a hole transport layer (HTL) 140, an emission layer (EML) 150. Onto the emission layer (EML) 150 an electron transport layer (ETL) 160 is disposed. Onto the electron transport layer (ETL) 160 the organic semiconductor layer 170 is disposed. The organic semiconductor layer 170 comprising or consisting of an alkali organic complex and a compound of formula 1 is formed directly on the ETL 160. The cathode electrode layer 190 is disposed directly onto the organic semiconductor layer 170.

Figure 3:
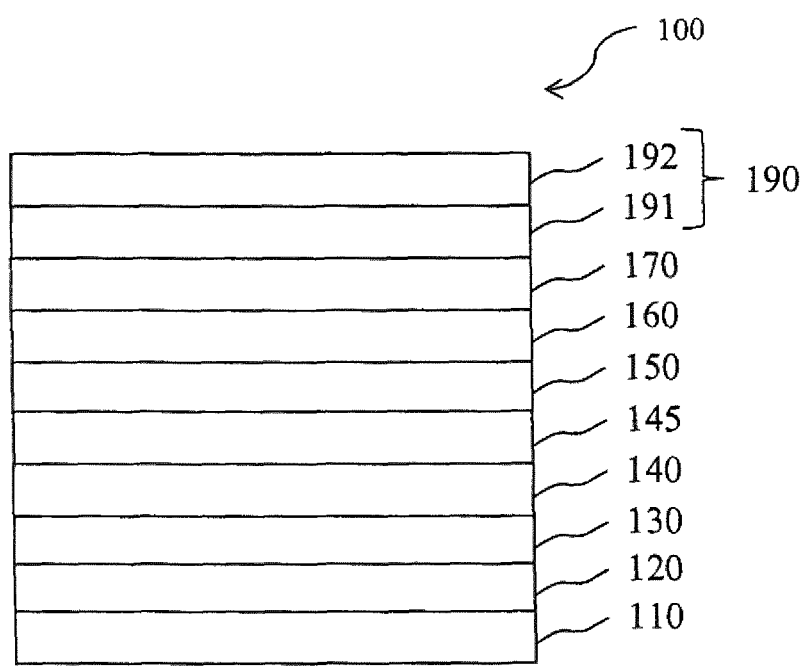
FIG. 3 is a schematic sectional view of an OLED, according to another exemplary embodiment of the present invention.

FIG. 3 is a schematic sectional view of an OLED 100, according to another exemplary embodiment of the present invention. FIG. 3 differs from FIG. 2 in that the OLED 100 of FIG. 3 comprises an electron blocking layer (EBL) 145 and a cathode electrode 190 comprising a first cathode layer 191 and a second cathode layer 192.

Referring to FIG. 3 the OLED 100 includes a substrate 110, an anode electrode 120, a hole injection layer (HIL) 130, a hole transport layer (HTL) 140, an electron blocking layer (EBL) 145 and an emission layer (EML) 150. Onto the emission layer (EML) 150 an electron transport layer (ETL) 160 is disposed. Onto the electron transport layer (ETL) 160 the organic semiconductor layer 170 is disposed. The organic semiconductor layer 170 comprising or consisting of an alkali organic complex and a compound of formula 1 is formed directly on the ETL 160. The cathode electrode layer 190 comprises of a first cathode layer 191 and a second cathode layer 191. The first cathode layer 191 is a substantially metallic layer and it is disposed directly onto the organic semiconductor layer 170. The second cathode layer 192 is disposed directly onto the first cathode layer 191.

Figure 4:
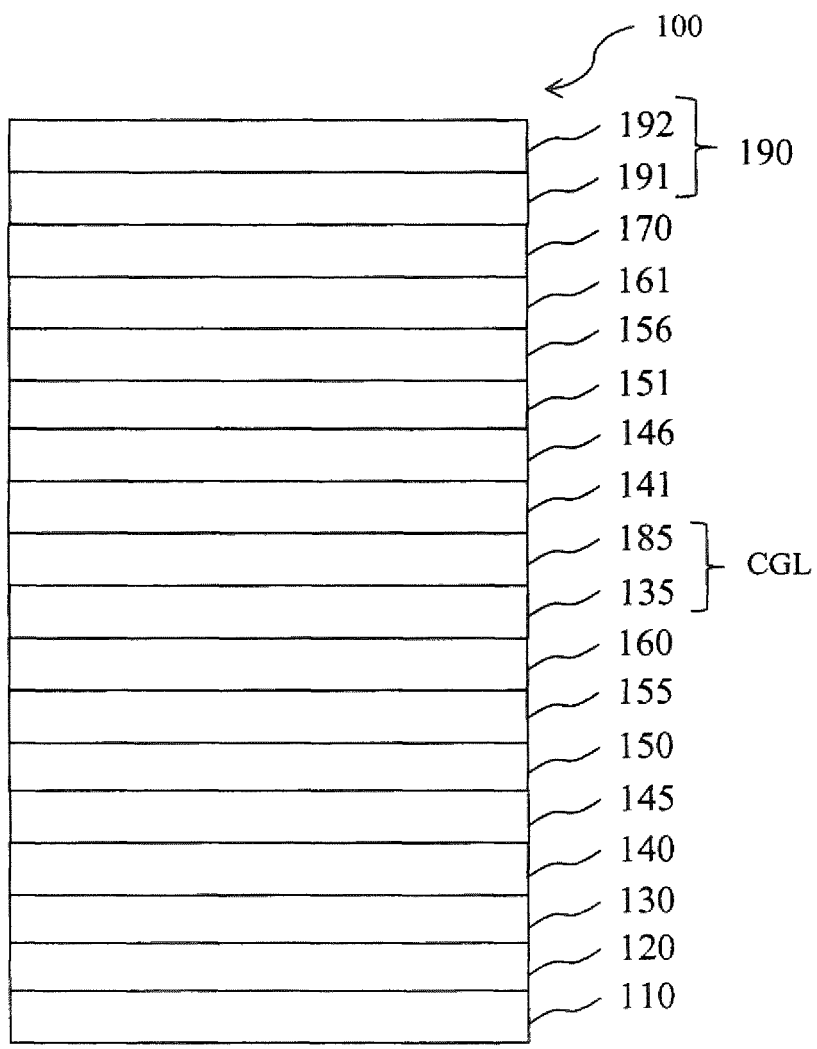
FIG. 4 is a schematic sectional view of a tandem OLED comprising a charge generation layer, according to an exemplary embodiment of the present invention.

FIG. 4 is a schematic sectional view of a tandem OLED 100, according to another exemplary embodiment of the present invention. FIG. 4 differs from FIG. 2 in that the OLED 100 of FIG. 4 further comprises a charge generation layer and a second emission layer.

Referring to FIG. 4 the OLED 100 includes a substrate 110, an anode electrode 120, a first hole injection layer (HIL) 130, a first hole transport layer (HTL) 140, a first electron blocking layer (EBL) 145, a first emission layer (EML) 150, a first hole blocking layer (HBL) 155, a first electron transport layer (ETL) 160, an n-type charge generation layer (n-type CGL) 185, a p-type charge generation layer (p-type GCL) 135, a second hole transport layer (HTL) 141, a second electron blocking layer (EBL) 146, a second emission layer (EML) 151, a second hole blocking layer (EBL) 156, a second electron transport layer (ETL) 161, the organic semiconductor layer 170, a first cathode electrode layer 191 and a second cathode electrode layer 192. The organic semiconductor layer 170 comprising or consisting of an alkali organic complex and a compound of formula 1 is disposed directly onto the second electron transport layer 161 and the first cathode electrode layer 191 is disposed directly onto the organic semiconductor layer 170. The second cathode electrode layer 192 is disposed directly onto the first cathode electrode layer 191.

In the description above the method of manufacture an OLED 100 of the present invention is started with a substrate 110 onto which an anode electrode 120 is formed, on the anode electrode 120, a first hole injection layer 130, first hole transport layer 140, optional a first electron blocking layer 145, a first emission layer 150, optional a first hole blocking layer 155, optional an ETL 160, an n-type CGL 185, a p-type CGL 135, a second hole transport layer 141, optional a second electron blocking layer 146, a second emission layer 151, an optional second hole blocking layer 156, an optional at least one second electron transport layer 161, the organic semiconductor layer 170, a first cathode electrode layer 191 and an optional second cathode electrode layer 192 are formed, in that order or the other way around.

While not shown in FIG. 1, FIG. 2, FIG. 3 and FIG. 4, a sealing layer may further be formed on the cathode electrodes 190, in order to seal the OLEDs 100. In addition, various other modifications may be applied thereto.

EXAMPLES

General Procedures
Synthesis of Compounds of Formula 1
Compounds for formula 1 may be synthesized via two different routes, see Scheme 1.

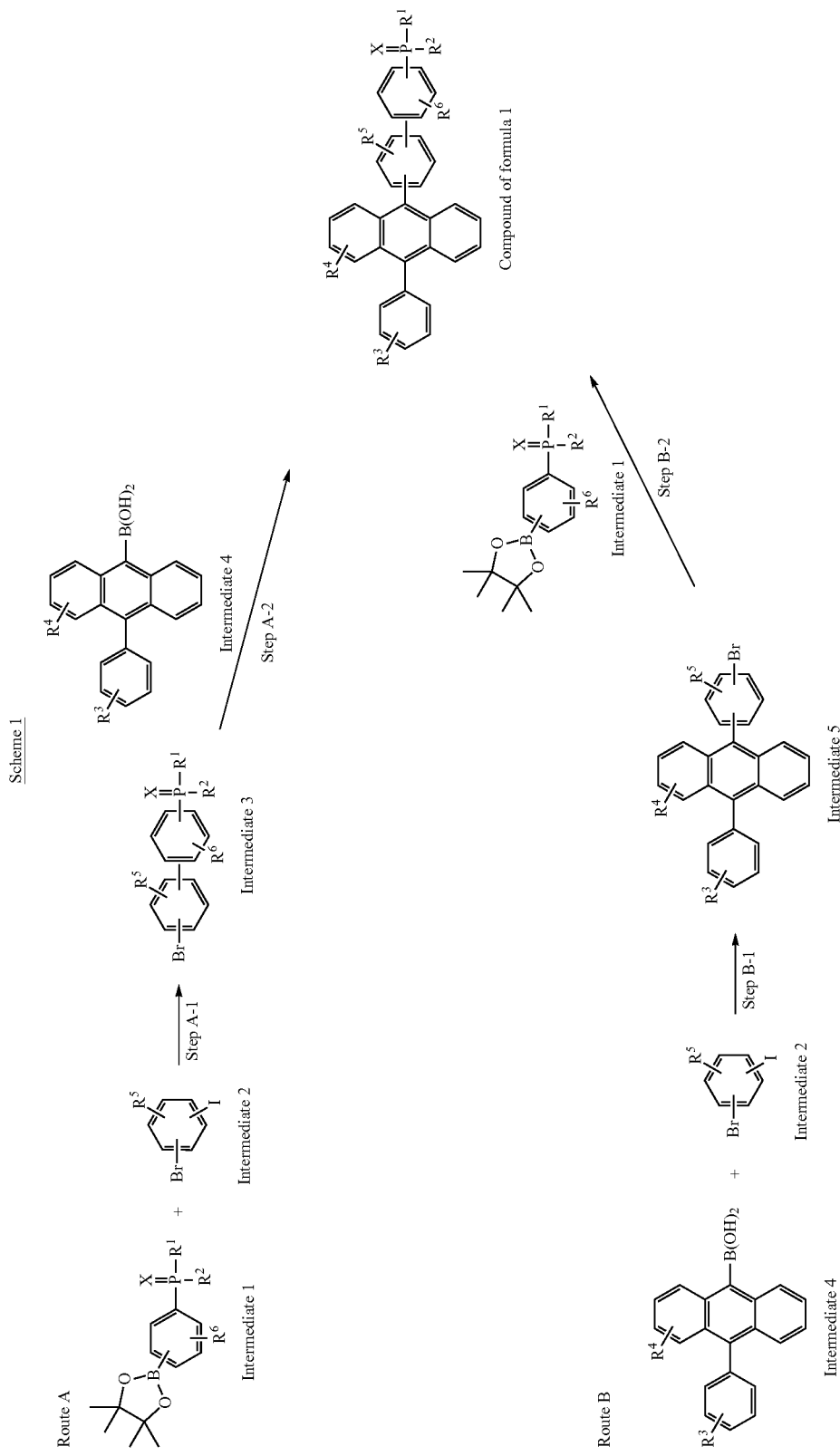

In Route A, Intermediate 1 is reacted with Intermediate 2 under Suzuki conditions to yield Intermediate 3. Intermediate 3 is reacted with Intermediate 4 under Suzuki conditions to yield compound of formula 1.

In Route B, Intermediate 4 is reacted with Intermediate 2 under Suzuki conditions to yield Intermediate 5. Intermediate 5 is reacted with Intermediate 1 to yield compound of formula 1.

(3'-bromo-[1,1'-biphenyl]-4-yl)diphenylphosphine oxide

A 1-L-Schlenk flask was flushed with nitrogen and charged with diphenyl(4-(4,4,5,5-tetramethyl-1,3,2-dioxaborolan-2-yl)phenyl)phosphine oxide (50.8 g, 126 mmol), 1-bromo-3-iodobenzene (71.1 g, 252 mmol), and Pd(PPh$_3$)$_4$ (4.4 g, 3.78 mmol). De-aerated glyme (500 mL) and aq. 2 M K$_2$CO$_3$ (52 g, 378 mmol K$_2$CO$_3$ in 190 mL water) were added and the resulting mixture was stirred at 95° C. under a nitrogen atmosphere. After 18 h, the reaction mixture was allowed to cool down to room temperature and glyme was evaporated under reduced pressure. Dichloromethane was added and the mixture was washed with water. The organic phase was dried over MgSO$_4$, filtered, and concentrated. The obtained oil poured onto a pad of silica gel and rinsed with dichloromethane. After elution of the impurities, the product was eluted with ethyl acetate. The ethyl acetate fraction was concentrated to a minimal amount and precipitation was induced by addition of MTBE. The formed precipitate was collected by suction filtration and washed with additional MTBE. After drying, 45.6 g (84%) of a beige solid were obtained. HPLC: 99.34%, GC/MS 98.8%, m/z=433 ([M]$^+$).

(3'-bromo-[1,1'-biphenyl]-3-yl)diphenylphosphine oxide

Following the procedure described for (3'-bromo-[1,1'-biphenyl]-4-yl)diphenylphosphine oxide above using diphenyl(3-(4,4,5,5-tetramethyl-1,3,2-dioxaborolan-2-yl)phenyl) phosphine oxide (25.0 g, 62 mmol), 1-bromo-3-iodobenzene (26.2 g, 93 mmol), Pd(PPh$_3$)$_4$ (2.2 g, 1.9 mmol), glyme (250 mL), and aq. 2 M K$_2$CO$_3$ (26 g, 186 mmol K$_2$CO$_3$ in 95 mL water), 24.4 g (90%) of a yellowish solid were obtained. HPLC/ESI-MS: 98.20%, m/z=434 ([M+H]$^+$).

MX3

A 1-L-Schlenk flask was flushed with nitrogen and charged with (3'-bromo-[1,1'-biphenyl]-4-yl)diphenylphosphine oxide (45.4 g, 105 mmol), (10-phenylanthracen-9-yl) boronic acid (34.4 g, 116 mmol), and Pd(PPh$_3$)$_4$ (2.4 g, 2.1 mmol). De-aerated glyme (350 mL) and aq. 2 M K$_2$CO$_3$ (29 g, 210 mmol K$_2$CO$_3$ in 105 mL water) were added and the resulting mixture was stirred at 95° C. under a nitrogen atmosphere. After 18 h, the reaction mixture was allowed to cool down to room temperature. The precipitate was collected by suction filtration and washed with n-hexane. The obtained solid was dissolved in dichloromethane and filtered over a pad of Florisil®. The filtrate was concentrated to a minimal volume under reduced pressure and n-hexane was added. The obtained solid was collected by suction filtration and washed with n-hexane. After drying, 50.0 g (82.4 mmol, 78%) of a bright yellow solid were obtained. HPLC/ESI-MS: 99.93%, m/z=607 ([M+H]$^+$). Further purification was achieved by sublimation (HPLC: 100%).

MX2

Following the procedure described for MX3 using 9-(4-bromophenyl)-10-phenylanthracene (5.7 g, 13.8 mmol), diphenyl(3-(4,4,5,5-tetramethyl-1,3,2-dioxaborolan-2-yl) phenyl)phosphine oxide (6.2 g, 15.2 mmol), Pd(PPh$_3$)$_4$ (0.32 g, 0.28 mmol), glyme (50 mL), and 2 M aq. K$_2$CO$_3$ (5.7 g, 41.3 mmol K$_2$CO$_3$ in 21 mL water), 4.83 g (8.0 mmol, 58%) of an off-white solid were obtained. HPLC/ESI-MS: 100.00%, m/z=629 ([M+Na]$^+$).

MX4

Following the procedure described for MX3 using (3'-bromo-[1,1'-biphenyl]-3-yl)diphenylphosphine oxide (24.0 g, 55.4 mmol) and (10-(naphthalen-2-yl)anthracen-9-yl)boronic acid (18.2 g, 61.0 mmol), Pd(PPh$_3$)$_4$ (1.28 g, 1.11 mmol), glyme (200 mL), and aq. 2 M K$_2$CO$_3$ (15.3 g, 111 mmol K$_2$CO$_3$ in 56 mL water), 26.8 g (44.2 mmol, 80%) of a bright yellow solid were obtained. HPLC/ESI-MS: 98.82%, m/z=629 ([M+Na]$^+$). Further purification was achieved by sublimation (HPLC: 99.94%).

MX1

Following the procedure described for MX3 using 9-(4-bromophenyl)-10-phenylanthracene (8.0 g, 19.5 mmol), diphenyl(4-(4,4,5,5-tetramethyl-1,3,2-dioxaborolan-2-yl) phenyl)phosphine oxide (8.3 g, 20.5 mmol), Pd(PPh$_3$)$_4$ (0.45 g, 0.39 mmol), glyme (70 mL), and 2 M aq. K$_2$CO$_3$ (8.1 g, 58.6 mmol K$_2$CO$_3$ in 30 mL water), 7.23 g (14.0 mmol, 61%) of a yellowish solid were obtained. HPLC/ESI-MS: 99.60%, m/z=607 ([M+H]$^+$). Further purification was achieved by sublimation (HPLC: 99.84%).

Glass Transition Temperature

The glass transition temperature is measured under nitrogen and using a heating rate of 10 K per min in a Mettler Toledo DSC 822e differential scanning calorimeter as described in DIN EN ISO 11357, published in March 2010.

Rate Onset Temperature

The rate onset temperature is determined by loading 100 mg compound into a VTE source. The VTE source is heated at a constant rate of 15 K/min at a pressure of less than $10^{-5}$ mbar and the temperature inside the source measured with a thermocouple. Evaporation of the compound is detected with a QCM detector which detects deposition of the compound on the quartz crystal of the detector. The deposition rate on the quartz crystal is measured in ng-strom per second. To determine the rate onset temperature, the deposition rate is plotted against the VTE source temperature. The rate onset is the temperature at which noticeable deposition on the QCM detector occurs. For accurate results, the VTE source is heated and cooled three time and only results from the second and third run are used to determine the rate onset temperature.

To achieve good control over the evaporation rate of an organic compound, the rate onset temperature may be in the range of 200 to 255° C. If the rate onset temperature is below 200° C. the evaporation may be too rapid and therefore difficult to control. If the rate onset temperature is above 255° C. the evaporation rate may be too low which may result in low takt time and decomposition of the organic compound in VTE source may occur due to prolonged exposure to elevated temperatures.

The rate onset temperature is an indirect measure of the volatility of a compound. The higher the rate onset temperature the lower is the volatility of a compound.

Bottom Emission Devices with an Evaporated Emission Layer

For bottom emission devices—Examples 1 to 4 and comparative examples 1 to 6, a 15 Ω/cm 2 glass substrate (available from Corning Co.) with 100 nm ITO was cut to a size of 50 mm×50 mm×0.7 mm, ultrasonically cleaned with isopropyl alcohol for 5 minutes and then with pure water for 5 minutes, and cleaned again with UV ozone for 30 minutes, to prepare a first electrode.

Then, 92 wt.-% of N4,N4"-di(naphthalen-1-yl)-N4,N4"-diphenyl-[1,1':4',1"-terphenyl]-4,4"-diamine and 8 wt.-% of 2,2',2"-(cyclopropane-1,2,3-triylidene)tris(2-(p-cyanotetrafluorophenyl)acetonitrile) was vacuum deposited on the ITO electrode, to form a HIL having a thickness of 10 nm. Then N4,N4"-di(naphthalen-1-yl)-N4,N4"-diphenyl[1,1':4',1"-terphenyl]-4,4"-diamine was vacuum deposited on the HIL, to form a HTL having a thickness of 130 nm. 97 wt.-% of ABH113 (Sun Fine Chemicals) as a host and 3 wt.-% of NUBD370 (Sun Fine Chemicals) as a dopant were deposited on the HTL, to form a blue-emitting EML with a thickness of 20 nm.

Then, the organic semiconductor layer is formed by deposing a matrix compound and LiQ according to examples 1 to 4 and comparative example 1 and 7 by deposing of the matrix compound from a first deposition source and LiQ from a second deposition source directly on the EML. The organic semiconductor layer comprises 50 wt.-% matrix compound and 50 wt. % LiQ. In examples 1 to 4 the matrix compound is a compound of formula 1. The thickness of the organic semiconductor layer is 36 nm.

Then, the cathode electrode layer is formed by evaporating aluminium at ultra-high vacuum of $10^{-7}$ bar and deposing the aluminium layer directly on the organic semiconductor layer. A thermal single co-evaporation of one or several metals is performed with a rate of 0, 1 to 10 nm/s (0.01 to 1 Å/s) in order to generate a homogeneous cathode electrode with a thickness of 5 to 1000 nm. The thickness of the cathode electrode layer is 100 nm.

The OLED stack is protected from ambient conditions by encapsulation of the device with a glass slide. Thereby, a cavity is formed, which includes a getter material for further protection.

Bottom Emission Devices with a Solution-Processed Emission Layer

For bottom emission devices, a 15 Ω/cm 2 glass substrate (available from Corning Co.) with 100 nm ITO was cut to a size of 50 mm×50 mm×0.7 mm, ultrasonically cleaned with iso-propyl alcohol for 5 minutes and then with pure water for 5 minutes, and cleaned again with UV ozone for 30 minutes, to prepare a first electrode.

Then, PEDOT:PSS (Clevios P VP AI 4083) is spin-coated directly on top of the first electrode to form a 55 nm thick HIL. The HIL is baked on hotplate at 150° C. for 5 min. Then, a light-emitting polymer, for example MEH-PPV, is spin-coated directly on top of the HIL to form a 40 nm thick EML. The EML is baked on a hotplate at 80° C. for 10 min. The device is transferred to an evaporation chamber and the following layers are deposited in high vacuum.

Compound of formula 1 and an alkali organic complex are deposed directly on top of the EML to form the organic semiconductor layer with a thickness of 4 nm. A cathode electrode layer is formed by deposing a 100 nm thick layer of aluminium directly on top of the organic semiconductor layer.

Top Emission Devices

For top emission devices—Examples 5 to 8, the anode electrode was formed from 100 nm silver on glass which is prepared by the same methods as described above for bottom emission devices.

Then, 92 wt.-% of biphenyl-4-yl(9,9-diphenyl-9H-fluoren-2-yl)-[4-(9-phenyl-9H-carbazol-3-yl)phenyl]-amine (CAS 1242056-42-3) and 8 wt.-% of 2,2',2"-(cyclopropane-1,2,3-triylidene)tris(2-(p-cyanotetrafluorophenyl)acetonitrile) is vacuum deposited on the ITO electrode, to form a HIL having a thickness of 10 nm. Then biphenyl-4-yl(9,9-diphenyl-9H-fluoren-2-yl)-[4-(9-phenyl-9H-carbazol-3-yl)phenyl]-amine (CAS 1242056-42-3) is vacuum deposited on the HIL, to form a HTL having a thickness of 117 nm. Then N,N-bis(4-(dibenzo[b,d]furan-4-yl)phenyl)-[1,1':4',1"-terphenyl]-4-amine is deposed directly on top of the HTL to form an EBL with a thickness of 5 nm.

97 wt.-% of 2-(10-phenyl-9-anthracenyl)-benzo[b]naphtho[2,3-d]furan as a host and 3 wt.-% of blue emitter dopant described in WO2015-174682 are deposited on the EBL, to form a blue-emitting EML with a thickness of 20 nm.

Then, the organic semiconductor layer is formed by deposing compound of formula 1 according to examples 5 and 6 from a first deposition source and Li-1 from a second deposition source directly on the EML. The organic semiconductor layer comprises 70 wt.-% compound of formula 1 and 30 wt.-% Li-1. Further, the thickness d (in nm) of the organic semiconductor layer can be taken from Table 5.

In examples 7 and 8, an electron transport layer (ETL) is formed by deposing 5 nm of first matrix compound ETM-39 directly on the EML. ETM-39 is 2,4-diphenyl-6-(4',5',6'-triphenyl[1,1':2',1":3",1'":3'",1''''-quinquephenyi]-3'''-yl)-1,3,5-triazine. Then, the organic semiconductor layer is formed by deposing 70 wt.-% compound of formula 1 according to examples 5 and 6 from a first deposition source and 30 wt.-% Li-1 from a second deposition source directly on the ETL. Further, the thickness d (in nm) of the organic semiconductor layer can be taken from Table 5.

Then, the first cathode electrode layer is evaporated at ultra-high vacuum of $10^{-7}$ bar. Therefore, a thermal single co-evaporation of one or several metals is performed with a rate of 0, 1 to 10 nm/s (0.01 to 1 Å/s) in order to generate a homogeneous cathode electrode with a thickness of 5 to 1000 nm. Then, the second cathode electrode layer is deposed directly on to top of the first cathode electrode layer under the same conditions. The first cathode layer is formed by deposing 2 nm Yb directly onto the organic semiconductor layer. Then, the second cathode layer is formed by deposing 11 nm Ag directly onto the first cathode layer. 60 n biphenyl-4-yl(9,9-diphenyl-9H-fluoren-2-yl)-[4-(9-phenyl-9H-carbazol-3-yl)phenyl]-amine (CAS 1242056-42-3) is deposed directly on top of the second cathode electrode layer.

The OLED stack is protected from ambient conditions by encapsulation of the device with a glass slide. Thereby, a cavity is formed, which includes a getter material for further protection.

To assess the performance of the inventive examples compared to the prior art, the current efficiency is measured under ambient conditions (20° C.). Current voltage measurements are performed using a Keithley 2400 sourcemeter, and recorded in V. At 10 mA/cm² for bottom emission and 10 mA/cm² for top emission devices, a calibrated spectrometer CAS140 from Instrument Systems is used for measurement of CIE coordinates and brightness in Candela. Lifetime LT of bottom emission device is measured at ambient conditions (20° C.) and 10 mA/cm², using a Keithley 2400 sourcemeter, and recorded in hours. Lifetime LT of top emission device is measured at ambient conditions (20° C.) and 8 mA/cm². The brightness of the device is measured using a calibrated photo diode. The lifetime LT is defined as the time till the brightness of the device is reduced to 97% of its initial value.

In bottom emission devices, the emission is predominately Lambertian and quantified in percent external quantum efficiency (EQE). To determine the efficiency EQE in % the light output of the device is measured using a calibrated photodiode at 10 mA/cm2.

In top emission devices, the emission is forward directed, non-Lambertian and also highly dependent on the microcavity. Therefore, the efficiency EQE will be higher compared to bottom emission devices. To determine the efficiency EQE in % the light output of the device is measured using a calibrated photodiode at 10 mA/cm2.

Technical Effect of the Invention

In Table 4, the glass transition temperature, rate onset temperature and device performance in bottom emission devices are shown of examples 1 to 4 and comparative examples 1 to 7. The organic semiconductor layer comprises 50 wt.-% matrix compound and 50 wt.-% alkali organic complex LiQ. The organic semiconductor layer is contacting sandwiched between the emission layer and the cathode electrode layer. In example 1 to 4, the matrix compound is selected from a compound of formula 1.

In comparative example 1, compound A is used as matrix compound. Compound A comprises a phenylene group attached to the adjacent phosphorus containing group and the adjacent anthracenylene group. The operating voltage is 4.9 V and the external quantum efficiency is 4.9% EQE.

In comparative example 2, compound B is used as matrix compound. Compound B comprises a phenylene group attached to the adjacent phosphorus containing group and the adjacent anthracenylene group and a 2-napthyl substituent in 10-position on the anthracenylene group. The Tg is 134° C. but the rate onset temperature is too high for manufacturing of OLEDs. Operating voltage is similar to comparative example 1 but the efficiency is slightly improved to 5.4% EQE.

In comparative example 3, compound C is used as matrix compound. Compound C comprises a phenylene group attached to the adjacent phosphorus containing group and the adjacent anthracenylene group and a 1-napthyl substituent in 10-position on the anthracenylene group. The Tg is even higher at 139° C. and the rate onset is in the range suitable for manufacturing of OLEDs. Operating voltage and external quantum efficiency are in a similar range to comparative example 2.

In comparative example 4, compound D is used as matrix compound. Compound D comprises a phenylene group attached to the adjacent phosphorus containing group and the adjacent anthracenylene group and a biphenyl substituent in 10-position on the anthracenylene group. The Tg is slightly lower than in comparative examples 2 and 3 and the rate onset temperature is also reduced. Operating voltage and external quantum efficiency are in a similar range to comparative example 2 and 3.

In example 1 to 4, the matrix compound is a compound of formula 1. The matrix compound comprises a biphenylenen group attached to the adjacent phosphorus containing group and the adjacent anthracenylene group and a phenyl substituent in 10-position on the anthracenylene group. The Tg and rate onset temperature are in a range suitable for manufacturing of OLEDs. The operating voltage is significantly decreased to 4.2 to 4.4 V compared to comparative examples 1 to 4. The external quantum efficiency is significantly increased to 6.7 to 7.4% EQE. Particularly high external quantum efficiency is observed for compounds of formula 1 which contain a biphenylene group attached to the adjacent phosphorus containing group and/or the adjacent anthracenylene group in meta-position. The highest efficiency is obtained for matrix compound MX2.

In comparative example 5, compound E is used as matrix compound. Compound E comprises a biphenylene group attached to the adjacent phosphorus containing group and the adjacent anthracenylene group and a 2-naphthyl substituent in 10-position on the anthracenylene group. The rate onset temperature is extremely high at 293° C. Therefore, this compound is not suitable for manufacturing of OLEDs as thermal degradation in the VTE source may occur during the manufacturing process. Additionally, the external quantum efficiency is significantly lower compared to examples 1 to 4.

In comparative example 6, compound F is used as matrix compound. Compound F comprises a biphenylene group attached to the adjacent phosphorus containing group and the adjacent anthracenylene group and a biphenyl substituent in 10-position on the anthracenylene group. The rate onset temperature is even higher at 310° C. No devices have been fabricated due to the extremely low volatility of the compound.

In conclusion, compounds of formula 1 offer a unique benefit in terms of Tg, rate onset temperature and OLED performance. Organic light emitting devices comprising a semiconductor layer comprising an alkali organic complex and a compound of formula 1 may have lower operating voltage, higher efficiency and therefore lower power consumption.

In Table 5, the performance is shown of top emission devices comprising an organic semiconductor layer comprising 70 wt.-% compound of formula 1 and 30 wt.-% Li-1. Li-1 is an alkali organic complex, see Table 1.

In example 5 and 6, the organic semiconductor layer is contacting sandwiched between the emission layer and the cathode electrode. Very low operating voltages and high external quantum efficiencies are obtained.

In examples 7 and 8, the organic semiconductor layer is contacting sandwiched between an electron transport layer and the cathode electrode. ETM-39 is a compound having a dipole moment ≥0 and ≤2.5 Debye. In comparison to examples 5 and 6, the operating voltage is comparable but the external quantum efficiency is significantly improved from 14% to 17% EQE.

In summary, a surprising improvement in performance is achieved when using an organic semiconductor layer comprising a compound of formula 1 and an alkali organic complex. A substantial increase in external quantum efficiency can be achieved when an electron transport layer is arranged between the emission layer and the organic semiconductor layer.

TABLE 4

Performance data of the compounds and bottom emission devices comprising an organic semiconductor layer comprising 50 wt.-% matrix compound and 50 wt.-% LiQ

| | Matrix compound | Structure of matrix compound | Tg [° C.] | rate onset temperature [° C.] | U at 10 mA/ cm² [V] | EQE at 10 mA/ cm² [%] |
|---|---|---|---|---|---|---|
| Comparative example 1 | Compound A | | 112 | 227 | 4.92 | 4.9 |
| Comparative example 2 | Compound B | | 134 | 270 | 4.91 | 5.4 |
| Comparative example 3 | Compound C | | 139 | 247 | 4.81 | 5.6 |
| Comparative example 4 | Compound D | | 130 | 231 | 4.71 | 5.5 |
| Example 1 | MX1 | | 134 | 252 | 4.26 | 6.7 |

TABLE 4-continued

Performance data of the compounds and bottom emission devices comprising an organic semiconductor layer comprising 50 wt.-% matrix compound and 50 wt.-% LiQ

| | Matrix compound | Structure of matrix compound | Tg [° C.] | rate onset temperature [° C.] | U at 10 mA/ cm² [V] | EQE at 10 mA/ cm² [%] |
|---|---|---|---|---|---|---|
| Example 2 | MX2 | | 121 | 236 | 4.20 | 7.4 |
| Example 3 | MX3 | | 121 | 232 | 4.38 | 6.9 |
| Example 4 | MX4 | | 113 | 224 | 4.43 | 6.8 |
| Comparative example 5 | Compound E | | 152 | 293 | 4.45 | 5.8 |

TABLE 4-continued

Performance data of the compounds and bottom emission devices comprising an organic semiconductor layer comprising 50 wt.-% matrix compound and 50 wt.-% LiQ

| | Matrix compound | Structure of matrix compound | Tg [° C.] | rate onset temperature [° C.] | U at 10 mA/cm² [V] | EQE at 10 mA/cm² [%] |
|---|---|---|---|---|---|---|
| Comparative example 6 | Compound F | 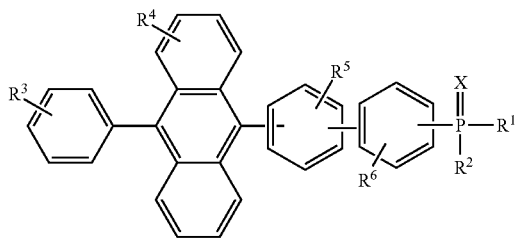 | 145 | 310 | — | — |

TABLE 5

Performance data of top emission devices comprising an organic semiconductor layer comprising 70 wt.-% compound of formula 1 and 30 wt.-% Li-1, an optional electron transport layer (ETL) and a cathode electrode layer comprising a first and second cathode layer. The ETL comprises a first matrix compound.

| | First matrix compound | Thickness ETL [nm] | Compound of formula 1 | Thickness organic semiconductor layer [nm] | U at 10 mA/cm² [V] | EQE at 10 mA/cm² [%] |
|---|---|---|---|---|---|---|
| Example 5 | — | 0 | MX3 | 37 | 3.6 | 14 |
| Example 6 | — | 0 | MX2 | 36 | 3.5 | 14 |
| Example 7 | ETM-39 | 5 | MX3 | 30 | 3.6 | 17 |
| Example 8 | ETM-39 | 5 | MX2 | 30 | 3.5 | 17 |

From the foregoing detailed description, claims and examples, it will be evident that modifications and variations can be made to the compositions and methods of the invention without departing from the spirit and scope of the invention. Therefore, it is intended that all modifications made to the invention without departing from the spirit and scope of the invention come within the scope of the appended claims.

The invention claimed is:

1. Organic light emitting diode comprising an anode electrode, a cathode electrode, at least one emission layer and an organic semiconductor layer, wherein the organic semiconductor layer is arranged between the anode electrode and the cathode electrode and the organic semiconductor layer comprises an alkali organic complex and a compound of formula 1

Formula 1 wherein
X is selected from O, S or Se; and
$R^1$ and $R^2$ are independently selected from the group consisting of $C_6$ to $C_{18}$ aryl group and $C_5$ to $C_{18}$ heteroaryl group, wherein each of $R^1$ and $R^2$ may independently be unsubstituted or substituted with at least one $C_1$ to $C_{12}$ alkyl group or $C_1$ to $C_{12}$ alkoxy group; and
each $R^3$, $R^4$, $R^5$, and $R^6$ are independently selected from the group consisting of H, $C_1$ to $C_{12}$ alkyl group or $C_1$ to $C_{12}$ alkoxy group.

2. Organic light emitting diode according to claim 1, wherein the compound of formula 1 comprises (i) a biphenylene group comprising $R^5$ and $R^6$, (ii) a phosphorous containing group comprising X, $R^1$, and $R^2$, and (iii) an anthracenylene group comprising $R^4$, wherein the biphenylene group is attached to the adjacent phosphorous containing group and/or the adjacent anthracenylene group in meta-position.

3. Organic light emitting diode according to claim 1, wherein the organic semiconductor layer is arranged between the emission layer and the cathode electrode.

4. Organic light emitting diode according to claim 1, wherein the organic light emitting diode further comprises an electron transport layer arranged between the emission layer and the organic semiconductor layer.

5. Organic light emitting diode according to claim 1, wherein the cathode electrode comprises at least one substantially metallic cathode layer comprising a first zero-valent metal selected from the group consisting of alkali metal, alkaline earth metal, rare earth metal, group 3 transition metal and mixtures thereof.

6. Organic light emitting diode according to claim 5, wherein the substantially metallic cathode layer further comprises a second zero-valent metal, wherein the second zero-valent metal is selected from a main group metal or a transition metal; and wherein the second zero-valent metal is different from the first zero-valent metal.

7. Organic light emitting diode, according to claim 6, wherein the second zero-valent metal is selected from the group consisting of Li, Na, K, Cs, Mg, Ca, Sr, Ba, Sc, Y, Yb, Ti, V, Cr, Mn, Fe, Co, Ni, Cu, Zn, Ag, Au, Al, Ga, In, Sn, Te, Bi, Pb and mixtures thereof.

8. Organic light emitting diode according to claim 1, wherein the alkali organic complex is a lithium organic complex.

9. Method for preparing an organic light emitting diode according to claim 1, the method comprising a step of:
co-depositing at least one alkali organic complex and at least one compound of formula 1 as defined in claim 1

Formula 1

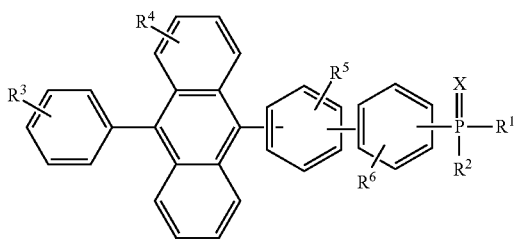

on the anode electrode, on the cathode electrode, or on one or more layers formed on the anode electrode or the cathode electrode.

10. Method according to claim 9, comprising the steps of:
depositing the anode electrode on a substrate;
depositing the at least one emission layer on the anode;
depositing the organic semiconductor layer on the emission layer; and
depositing the cathode electrode on the organic semiconductor layer.

11. Method according to claim 9, wherein depositing the organic semiconductor layer comprises vacuum thermal evaporation.

12. A compound of formula 1

Formula 1

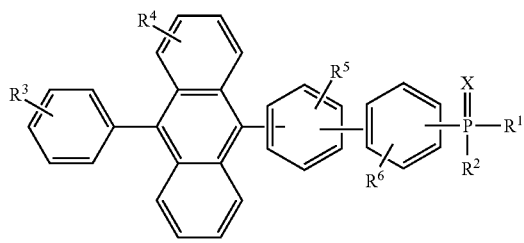

wherein

X is selected from O, S or Se;

$R^1$ and $R^2$ are independently selected from the group consisting of $C_6$ to $C_{18}$ aryl group and $C_5$ to $C_{18}$ heteroaryl group, wherein each of $R^1$ and $R^2$ may independently be unsubstituted or substituted with at least one $C_1$ to $C_{12}$ alkyl group or $C_1$ to $C_{12}$ alkoxy group; and each $R^3$, $R^4$, $R^5$, and $R^6$ are independently selected from the group consisting of H, $C_1$ to $C_{12}$ alkyl group or $C_1$ to $C_{12}$ alkoxy group.

13. The compound according to claim 12, wherein $R^1$ and $R^2$ are independently selected from $C_6$ to $C_{18}$ aryl group.

14. The compound according to claim 12, wherein X is selected as O.

15. The compound according to claim 12, wherein the compound of formula 1 comprises (i) a biphenylene group comprising $R^5$ and $R^6$, (ii) a phosphorous containing group comprising X, $R^1$, and $R^2$, and (iii) an anthracenylene group comprising $R^4$, wherein the biphenylene group is attached to the adjacent phosphorous containing group and/or the adjacent anthracenylene group in meta-position.

16. Organic light emitting diode according to claim 1, wherein each of $R^1$ and $R^2$ may independently be unsubstituted or substituted with at least one $C_1$ to $C_4$ alkyl group or $C_1$ to $C_4$ alkoxy group.

17. Organic light emitting diode according to claim 1, wherein each $R^3$, $R^4$, $R^5$, and $R^6$ are independently selected from the group consisting of H, $C_1$ to $C_4$ alkyl group, and $C_1$ to $C_4$ alkoxy group.

18. Organic light emitting diode according to claim 4, wherein the electron transport layer comprises a first organic matrix compound with a dipole moment of about $\geq 0$ and $\leq 2.5$ Debye.

19. Organic light emitting diode according to claim 7, wherein the second zero-valent metal is selected from the group consisting of Ag, Au, Zn, Te, Yb, Ga, Bi, Ba, Ca, Al and mixtures thereof.

20. Organic light emitting diode according to claim 7, wherein the second zero-valent metal is selected from the group consisting of Ag, Zn, Te, Yb, Ga, Bi and mixtures thereof.

* * * * *